(12) United States Patent
Baltis et al.

(10) Patent No.: US 12,405,539 B2
(45) Date of Patent: Sep. 2, 2025

(54) SUBSTRATE SUPPORT AND SUBSTRATE TABLE

(71) Applicant: ASML NETHERLANDS B.V., Veldhoven (NL)

(72) Inventors: Coen Hubertus Matheus Baltis, Eindhoven (NL); Nicolaas Ten Kate, Almkerk (NL); Marcus Martinus Petrus Adrianus Vermeulen, Leende (NL); Siegfried Alexander Tromp, Knegsel (NL); Frank Pieter Albert Van Den Berkmortel, Deurne (NL); Niek Jacobus Johannes Roset, Eindhoven (NL); Gijs Kramer, Nijmegen (NL); Nicolaas Petrus Marcus Brantjes, Eindhoven (NL); Michiel Theodorus Jacobus Fonteyn, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 518 days.

(21) Appl. No.: 17/798,354

(22) PCT Filed: Jan. 25, 2021

(86) PCT No.: PCT/EP2021/051581
§ 371 (c)(1),
(2) Date: Aug. 9, 2022

(87) PCT Pub. No.: WO2021/170320
PCT Pub. Date: Sep. 2, 2021

(65) Prior Publication Data
US 2023/0075771 A1    Mar. 9, 2023

(30) Foreign Application Priority Data

Feb. 24, 2020  (EP) ..................... 20158919
Mar. 17, 2020  (EP) ..................... 20163571

(51) Int. Cl.
*G03F 7/00* (2006.01)
*H01L 21/687* (2006.01)

(52) U.S. Cl.
CPC .......... *G03F 7/707* (2013.01); *G03F 7/70341* (2013.01); *G03F 7/70808* (2013.01);
(Continued)

(58) Field of Classification Search
None
See application file for complete search history.

(56) References Cited

U.S. PATENT DOCUMENTS

| 6,952,253 | B2 | 10/2005 | Lof et al. |
| 9,354,528 | B2 | 5/2016 | Bex et al. |

(Continued)

FOREIGN PATENT DOCUMENTS

| EP | 2261743 | 5/2012 |
| EP | 1420298 | 2/2013 |

(Continued)

OTHER PUBLICATIONS

International Search Report dated Mar. 26, 2021, issued in corresponding International Application No. PCT/EP2021/051581 (3 pgs.).

(Continued)

*Primary Examiner* — Binu Thomas
(74) *Attorney, Agent, or Firm* — Pillsbury Winthrop Shaw Pittman, LLP

(57) ABSTRACT

A substrate support for supporting a substrate in a lithographic apparatus, the substrate support including: a support body configured to support the substrate; a main body separate from the support body and configured to support the support body, the main body including a thermal conditioner configured to thermally condition the main body and/or support body and/or substrate; and an extractor body sur- (Continued)

rounding the main body and the support body, the extractor body having an extraction channel configured to extract fluid from near a peripheral part of the substrate.

20 Claims, 14 Drawing Sheets

(52) U.S. Cl.
CPC ...... *G03F 7/70875* (2013.01); *H01L 21/6875* (2013.01); *H01L 21/68785* (2013.01)

(56) References Cited

U.S. PATENT DOCUMENTS

| | | | |
|---|---|---|---|
| 10,168,621 B2 | 1/2019 | Dekkers et al. | |
| 10,509,335 B2 | 12/2019 | Nakajima et al. | |
| 2002/0074635 A1 | 6/2002 | Hattori et al. | |
| 2004/0207824 A1 | 10/2004 | Lof et al. | |
| 2006/0102277 A1 | 5/2006 | Zaal et al. | |
| 2007/0109521 A1* | 5/2007 | Nishii | G03F 7/70341 355/72 |
| 2007/0146664 A1 | 6/2007 | Zaal et al. | |
| 2007/0153244 A1 | 7/2007 | Zaal et al. | |
| 2007/0242242 A1* | 10/2007 | Nagasaka | G03F 7/707 355/53 |
| 2007/0258080 A1 | 11/2007 | Brink et al. | |
| 2008/0158526 A1 | 7/2008 | Hennus et al. | |
| 2009/0296068 A1* | 12/2009 | Castelijns | G03F 7/70716 355/72 |
| 2010/0045949 A1 | 2/2010 | Nakano et al. | |
| 2011/0181849 A1* | 7/2011 | Patel | G03F 7/70875 29/592 |
| 2011/0222033 A1 | 9/2011 | Ten Kate et al. | |
| 2011/0228248 A1 | 9/2011 | Lafarre et al. | |
| 2012/0212725 A1 | 8/2012 | Lafarre et al. | |
| 2012/0274920 A1 | 11/2012 | Bex et al. | |
| 2012/0307216 A1 | 12/2012 | Laurent et al. | |
| 2013/0189802 A1 | 7/2013 | Tromp et al. | |
| 2015/0077728 A1 | 3/2015 | Laurent et al. | |
| 2015/0109599 A1* | 4/2015 | Koevoets | G03F 7/707 355/73 |
| 2015/0124234 A1 | 5/2015 | Lafarre et al. | |
| 2017/0312826 A1 | 11/2017 | Lafarre et al. | |
| 2018/0107107 A1* | 4/2018 | Kramer | G03F 7/70716 |
| 2018/0231897 A1* | 8/2018 | Jeunink | G03F 7/707 |
| 2018/0267412 A1 | 9/2018 | Laurent et al. | |
| 2019/0163066 A1* | 5/2019 | Kramer | G03F 7/707 |
| 2019/0235395 A1 | 8/2019 | Lafarre et al. | |
| 2020/0142325 A1 | 5/2020 | Ten Kate et al. | |

FOREIGN PATENT DOCUMENTS

| | | |
|---|---|---|
| JP | 2006-148101 | 6/2006 |
| JP | 2008-251754 | 10/2008 |
| JP | 2009-043879 | 2/2009 |
| JP | 2010-206113 | 9/2010 |
| JP | 2011-151397 | 8/2011 |
| JP | 2011-205093 | 10/2011 |
| JP | 2015-519755 | 7/2015 |
| TW | 201633000 | 9/2016 |
| WO | 99/49504 | 9/1999 |
| WO | 2013/178438 | 12/2013 |
| WO | 2013/178484 | 12/2013 |
| WO | 2015/064613 | 3/2017 |
| WO | 2017/102162 | 6/2017 |

OTHER PUBLICATIONS

Written Opinion of the International Searching Authority dated Mar. 26, 2021, issued in corresponding International Application No. PCT/EP2021/051581 (5 pgs.).

* cited by examiner

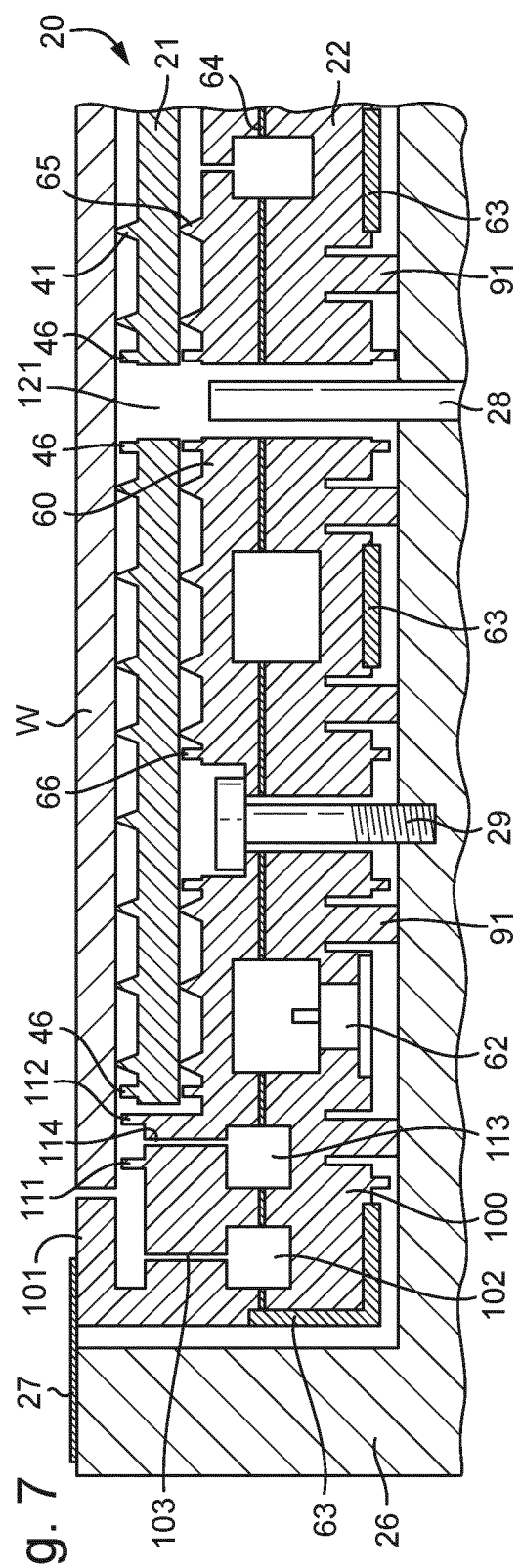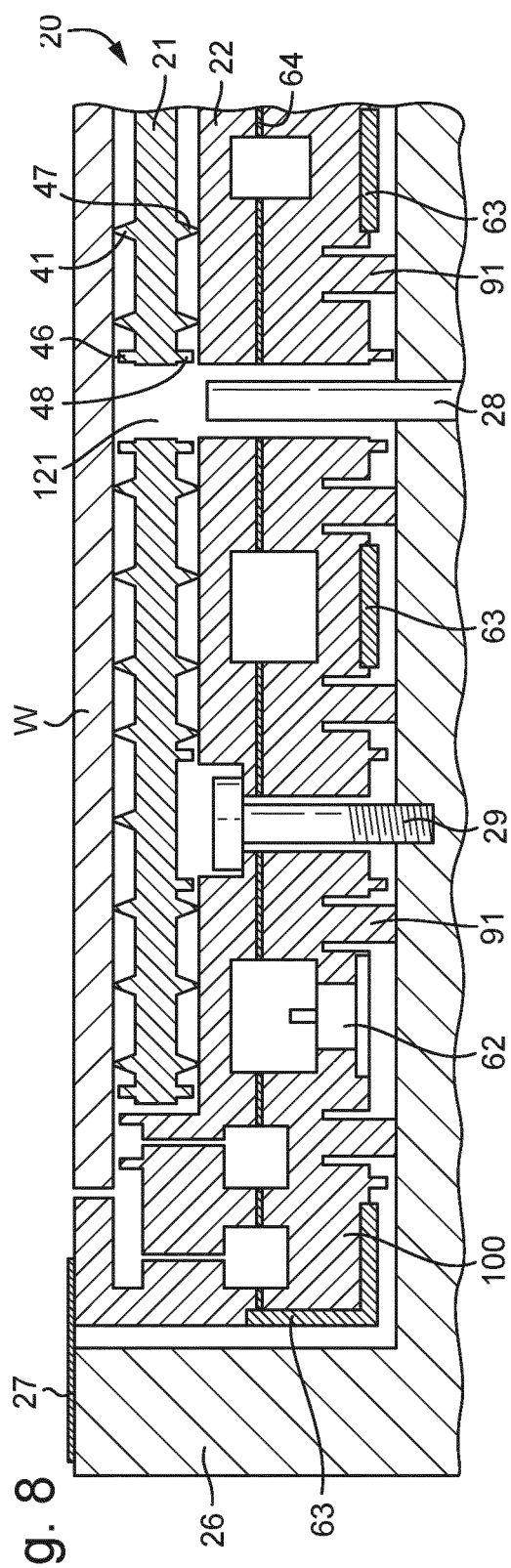

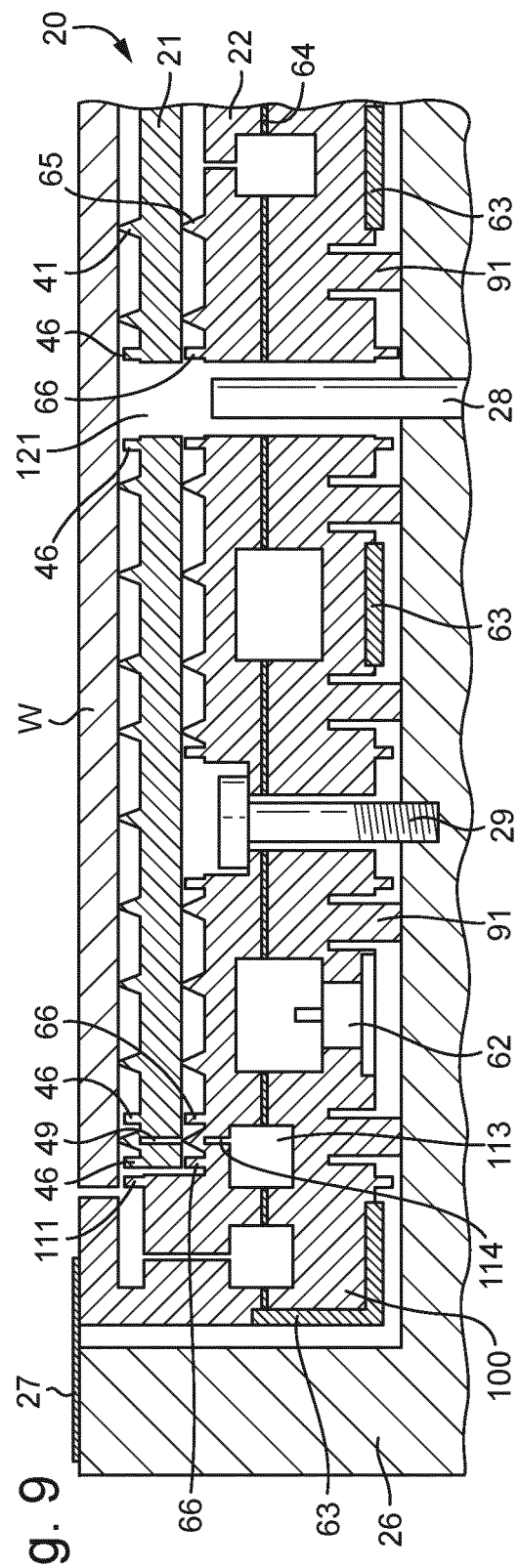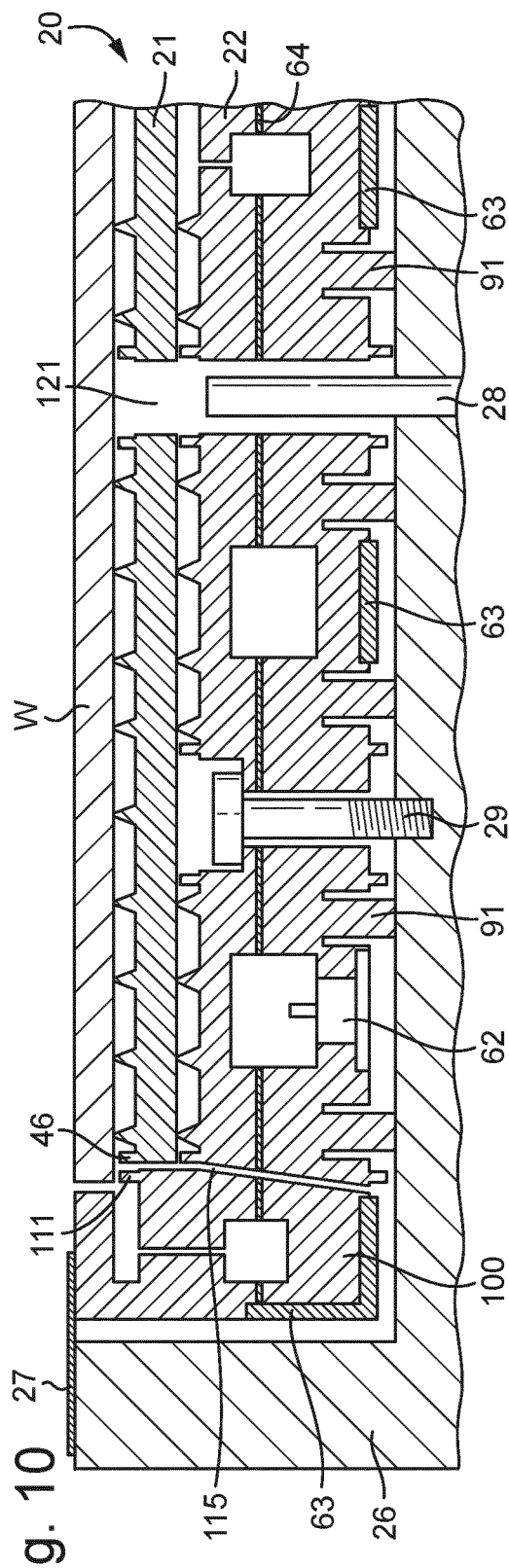

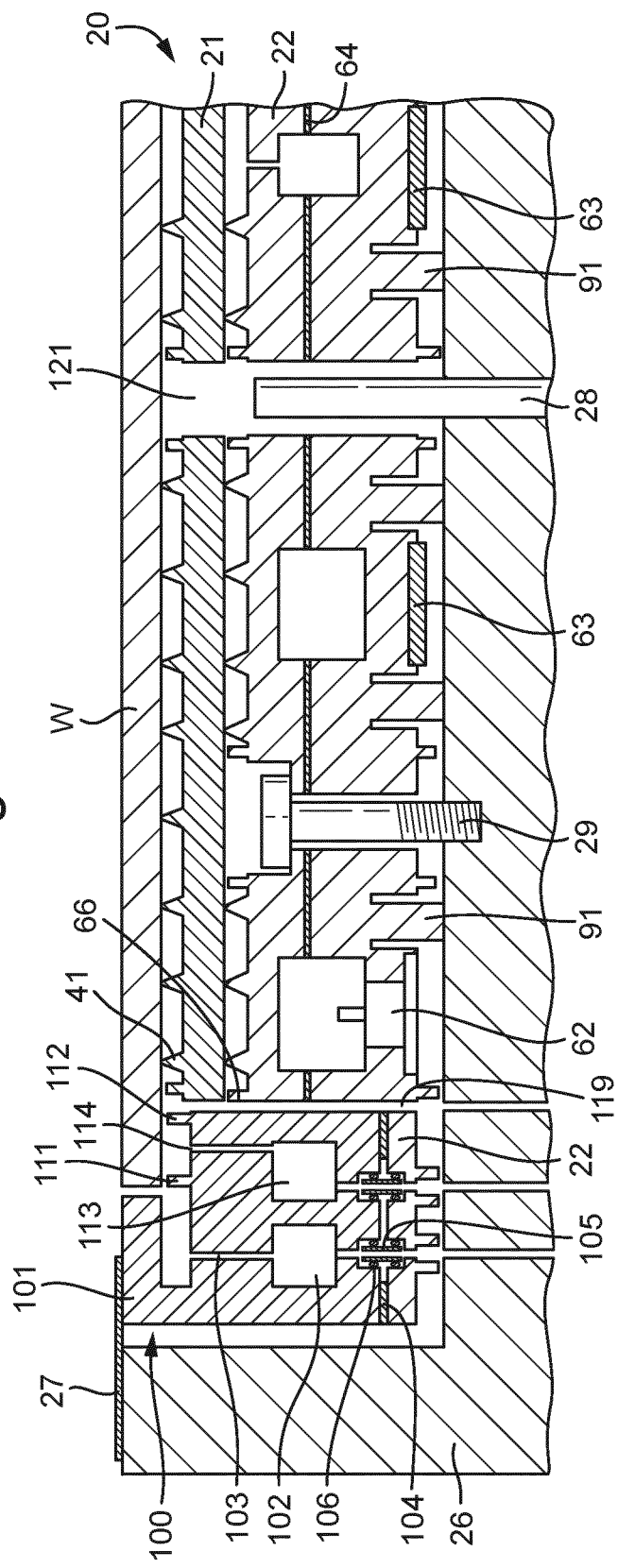

SUBSTRATE SUPPORT AND SUBSTRATE TABLE

CROSS-REFERENCE TO RELATED APPLICATIONS

This application is the U.S. national phase entry of PCT Patent Application No. PCT/EP2021/051581 filed on Jan. 25, 2021, which claims the benefit of priority of European Patent Application No. 20158919.9 filed on Feb. 24, 2020 and of European Patent Application No. 20163571.1 filed on Mar. 17, 2020 which are incorporated herein in their entireties by reference.

FIELD

The present invention relates to a substrate support for supporting a substrate in a lithographic apparatus, a substrate table, a method for supporting a substrate and a device manufacturing method.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer). Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm.

Further improvements in the resolution of smaller features may be achieved by providing an immersion fluid having a relatively high refractive index, such as water, on the substrate during exposure. The effect of the immersion fluid is to enable imaging of smaller features since the exposure radiation will have a shorter wavelength in the fluid than in gas. The effect of the immersion fluid may also be regarded as increasing the effective numerical aperture (NA) of the system and also increasing the depth of focus.

The immersion fluid may be confined to a localized area between the projection system of the lithographic apparatus and the substrate by a fluid handling structure. Fast relative movement between the substrate and the confined immersion liquid may cause leaking of the immersion fluid from the localized area. Such leaking is undesirable and may lead to defects on the substrate. The speed at which the substrate is stepped or scanned with respect to the projection system is thus limited. This limits the throughput of the lithographic apparatus.

SUMMARY

During a semiconductor manufacturing process, the substrate is supported on a substrate support. Over time, the substrate support wears out and needs to be replaced. It is an object of the present invention to provide a substrate support that is cheaper to maintain and that reduces the length of downtime required to service it when it is worn.

According to the present invention, there is provided substrate support for supporting a substrate in a lithographic apparatus, the substrate support comprising:
 a first support body configured to support the substrate;
 a main body separate from the first support body and configured to support the first support body, the main body comprising a thermal conditioner configured to thermally condition the main body, and/or the support body and/or the substrate; and
 an extractor body surrounding the main body and the support body, wherein the extractor body comprises a first extraction channel configured to extract fluid from near a peripheral part of the substrate.

According to the present invention, there is also provided a substrate table comprising: a substrate stage; and the substrate support.

According to the present invention, there is also provided a method for supporting a substrate in a lithographic apparatus on a substrate support comprising:
 supporting the substrate on a first support body of the substrate support;
 supporting the first support body on a main body separate from the first support body;
 thermally conditioning the main body, and/or the support body and/or the substrate with a thermal conditioner of the main body; and
 extracting fluid from near a peripheral part of the substrate through a first extraction channel of an extractor body surrounding the main body and the support body.

According to the present invention, there is also provided a method for replacing a first support body of a substrate support for supporting a substrate in a lithographic apparatus, the method comprising:
 connecting a carrier plate to the first support body such that the carrier plate covers pin holes that extend through the first support body in a thickness direction of the first support body;
 extending a plurality of pins through respective pin holes such that the pins support the carrier plate on their ends, wherein the pins extend through a main body of the substrate support below the first support body; and
 controlling movement of the pins so as to lower the first support body onto the main body or raise the first support body away from the main body.

According to the present invention, there is also provided a device manufacturing method using a lithographic apparatus, the method comprising:
 projecting a beam patterned by a patterning device onto a substrate while supporting the substrate with a substrate support; and
 performing the method for supporting the substrate in the lithographic apparatus or the method for replacing a first support body of a substrate support for supporting a substrate in a lithographic apparatus.

Further embodiments, features and advantages of the present invention, as well as the structure and operation of the various embodiments, features and advantages of the present invention, are described in detail below with reference to the accompanying drawings.

DESCRIPTION OF THE DRAWINGS

Embodiments of the invention will now be described, by way of example only, with reference to the accompanying schematic drawings, in which corresponding reference symbols indicate corresponding parts, and in which:

FIGS. 7 to 11 depict different versions of a substrate support according to the invention;

The features shown in the Figures are not necessarily to scale, and the size and/or arrangement depicted is not limiting. It will be understood that the Figures include optional features which may not be essential to the invention. Furthermore, not all of the features of the apparatus are depicted in each of the figures, and the Figures may only show some of the components relevant for describing a particular feature.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
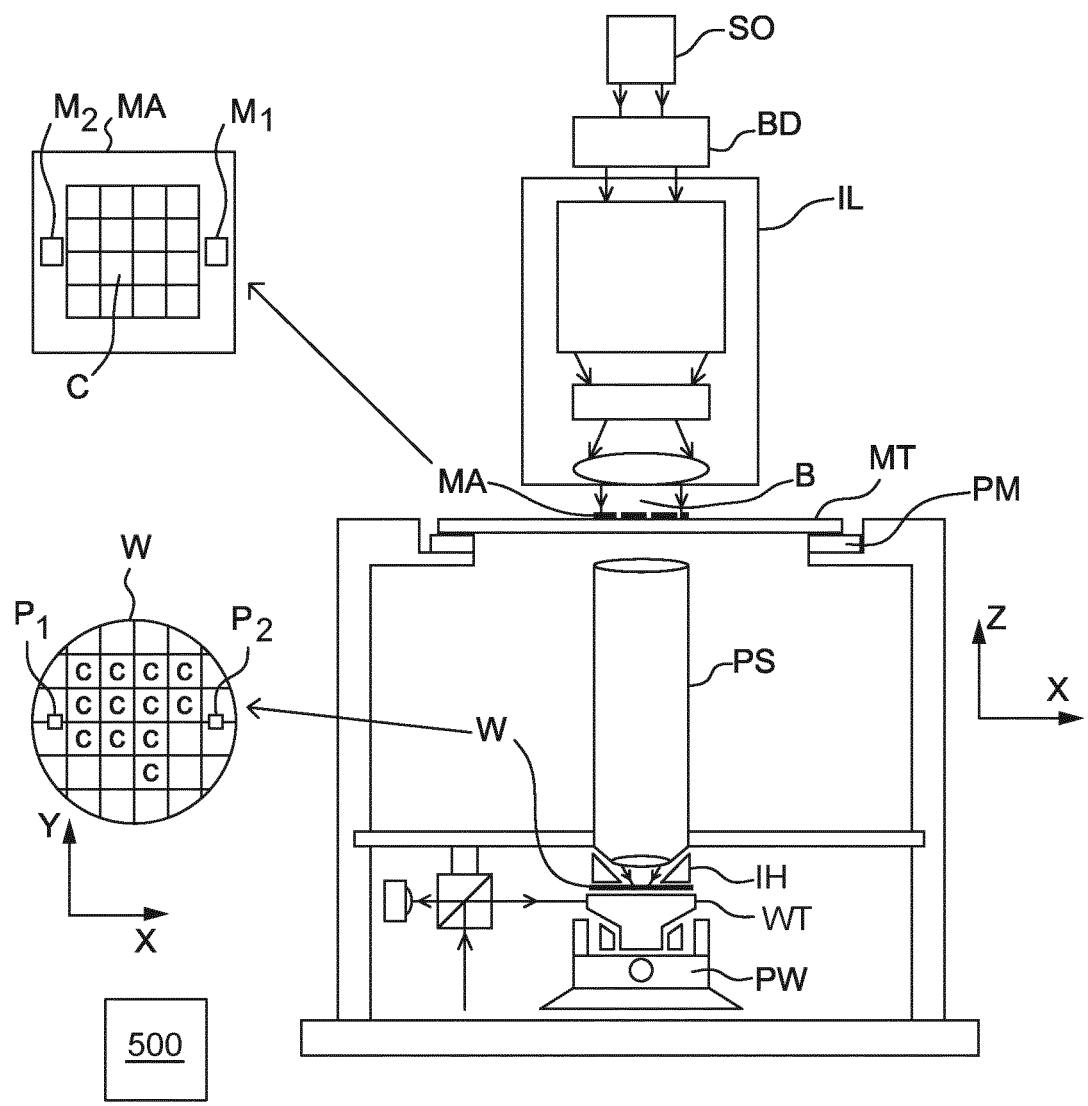
FIG. 1 depicts a schematic overview of the lithographic apparatus.

FIG. 1 schematically depicts a lithographic apparatus. The lithographic apparatus includes an illumination system (also referred to as illuminator) IL configured to condition a radiation beam B (e.g., UV radiation or DUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a substrate table) WT constructed to hold a substrate (e.g., a resist coated wafer) W and connected to a second positioner PW configured to accurately position the substrate support WT in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives the radiation beam B from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus is of a type wherein at least a portion of the substrate W may be covered by an immersion liquid having a relatively high refractive index, e.g., water, so as to fill an immersion space 11 between the projection system PS and the substrate W—which is also referred to as immersion lithography. More information on immersion techniques is given in U.S. Pat. No. 6,952,253, which is incorporated herein by reference.

The lithographic apparatus may be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus may comprise a measurement stage (not depicted in figures). The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks $M_1$, $M_2$ and substrate alignment marks $P_1$, $P_2$. Although the substrate alignment marks $P_1$, $P_2$ as illustrated occupy dedicated target portions, they may be located in spaces between target portions. Substrate alignment marks $P_1$, $P_2$ are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Immersion techniques have been introduced into lithographic systems to enable improved resolution of smaller features. In an immersion lithographic apparatus, a liquid layer of immersion liquid having a relatively high refractive index is interposed in the immersion space 11 between a projection system PS of the apparatus (through which the patterned beam is projected towards the substrate W) and the substrate W. The immersion liquid covers at least the part of the substrate W under a final element of the projection system PS. Thus, at least the portion of the substrate W undergoing exposure is immersed in the immersion liquid.

In commercial immersion lithography, the immersion liquid is water. Typically the water is distilled water of high purity, such as Ultra-Pure Water (UPW) which is commonly used in semiconductor fabrication plants. In an immersion system, the UPW is often purified and it may undergo additional treatment steps before supply to the immersion space 11 as immersion liquid. Other liquids with a high refractive index can be used besides water as the immersion liquid, for example: a hydrocarbon, such as a fluorohydrocarbon; and/or an aqueous solution. Further, other fluids besides liquid have been envisaged for use in immersion lithography.

In this specification, reference will be made in the description to localized immersion in which the immersion liquid is confined, in use, to the immersion space 11 between the final element and a surface facing the final element. The facing surface is a surface of substrate W or a surface of the supporting stage (or substrate support WT) that is co-planar with the surface of the substrate W. (Please note that reference in the following text to surface of the substrate W also refers in addition or in the alternative to the surface of the substrate support WT, unless expressly stated otherwise; and vice versa). A fluid handling structure IH present between the projection system PS and the substrate support WT is used to confine the immersion liquid to the immersion space 11. The immersion space 11 filled by the immersion liquid is smaller in plan than the top surface of the substrate W and the immersion space 11 remains substantially stationary relative to the projection system PS while the substrate W and substrate support WT move underneath.

Other immersion systems have been envisaged such as an unconfined immersion system (a so-called 'All Wet' immersion system) and a bath immersion system. In an unconfined immersion system, the immersion liquid covers more than the surface under the final element. The liquid outside the immersion space 11 is present as a thin liquid film. The liquid may cover the whole surface of the substrate W or even the substrate W and the substrate support WT co-planar with the substrate W. In a bath type system, the substrate W is fully immersed in a bath of immersion liquid.

The fluid handling structure IH is a structure which supplies the immersion liquid to the immersion space 11, removes the immersion liquid from the immersion space 11 and thereby confines the immersion liquid to the immersion space 11. It includes features which are a part of a fluid supply system. The arrangement disclosed in PCT patent application publication no. WO 99/49504 is an early fluid handling structure comprising pipes which either supply or recover the immersion liquid from the immersion space 11 and which operate depending on the relative motion of the stage beneath the projection system PS. In more recent designs, the fluid handling structure extends along at least a part of a boundary of the immersion space 11 between the final element of the projection system PS and the substrate support WT or substrate W, so as to in part define the immersion space 11.

The fluid handing structure IH may have a selection of different functions. Each function may be derived from a corresponding feature that enables the fluid handling structure IH to achieve that function. The fluid handling structure IH may be referred to by a number of different terms, each referring to a function, such as barrier member, seal member, fluid supply system, fluid removal system, liquid confinement structure, etc.

As a barrier member, the fluid handling structure IH is a barrier to the flow of the immersion liquid from the immersion space 11. As a liquid confinement structure, the structure confines the immersion liquid to the immersion space 11. As a seal member, sealing features of the fluid handling structure IH form a seal to confine the immersion liquid to the immersion space 11. The sealing features may include an additional gas flow from an opening in the surface of the seal member, such as a gas knife.

In an embodiment the fluid handling structure IH may supply immersion fluid and therefore be a fluid supply system.

In an embodiment the fluid handling structure IH may at least partly confine immersion fluid and thereby be a fluid confinement system.

In an embodiment the fluid handling structure IH may provide a barrier to immersion fluid and thereby be a barrier member, such as a fluid confinement structure.

In an embodiment the fluid handling structure IH may create or use a flow of gas, for example to help in controlling the flow and/or the position of the immersion fluid.

The flow of gas may form a seal to confine the immersion fluid so the fluid handling structure IH may be referred to as a seal member; such a seal member may be a fluid confinement structure.

In an embodiment, immersion liquid is used as the immersion fluid. In that case the fluid handling structure IH may be a liquid handling system. In reference to the aforementioned description, reference in this paragraph to a feature defined with respect to fluid may be understood to include a feature defined with respect to liquid.

A lithographic apparatus has a projection system PS. During exposure of a substrate W, the projection system PS projects a beam of patterned radiation onto the substrate W. To reach the substrate W, the path of the radiation beam B passes from the projection system PS through the immersion liquid confined by the fluid handling structure IH between the projection system PS and the substrate W. The projection system PS has a lens element, the last in the path of the beam, which is in contact with the immersion liquid. This lens element which is in contact with the immersion liquid may be referred to as 'the last lens element' or "the final element". The final element is at least partly surrounded by the fluid handling structure IH. The fluid handling structure IH may confine the immersion liquid under the final element and above the facing surface.

As depicted in FIG. 1, in an embodiment the lithographic apparatus comprises a controller 500. The controller 500 is configured to control the substrate table WT.

Figure 2:
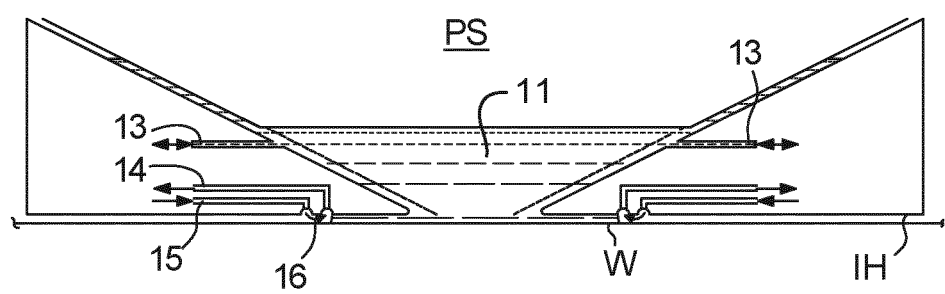
FIGS. 2 and 3 depict, in cross section, two different versions of a fluid handling system for use in a lithographic projection apparatus.

FIG. 2 schematically depicts a localized liquid supply system or fluid handling system. The liquid supply system is provided with a fluid handling structure IH (or liquid confinement structure), which extends along at least a part of a boundary of the space 11 between the final element of the projection system PS and the support table WT or substrate W. The fluid handling structure IH is substantially stationary relative to the projection system PS in the XY plane though there may be some relative movement in the Z direction (in the direction of the optical axis). In an example, a seal is formed between the fluid handling structure IH and the surface of the substrate W and may be a contactless seal such as a gas seal (such a system with a gas seal is disclosed in EP1,420,298) or liquid seal.

The fluid handling structure IH at least partly confines the immersion liquid in the space 11 between the final element of the projection system PS and the substrate W. The space 11 is at least partly formed by the fluid handling structure IH positioned below and surrounding the final element of the projection system PS Immersion liquid is brought into the space 11 below the projection system PS and within the fluid handling structure IH by one of liquid openings 13. The immersion liquid may be removed by another of liquid openings 13. The immersion liquid may be brought into the space 11 through at least two liquid openings 13. Which of liquid openings 13 is used to supply the immersion liquid and optionally which is used to remove the immersion liquid may depend on the direction of motion of the support table WT.

The immersion liquid may be confined in the space 11 by a contactless seal such as a gas seal 16 formed by a gas which, during use, is formed between the bottom of the fluid handling structure IH and the surface of the substrate W. The gas in the gas seal 16 is provided under pressure via inlet 15 to the gap between the fluid handling structure IH and substrate W. The gas is extracted via outlet 14. The overpressure on the gas inlet 15, vacuum level on the outlet 14 and geometry of the gap are arranged so that there is a high-velocity gas flow inwardly that confines the immersion liquid. Such a system is disclosed in US 2004/0207824, which is hereby incorporated by reference in its entirety. In an example, the fluid handling structure IH does not have the gas seal 16.

Figure 3:
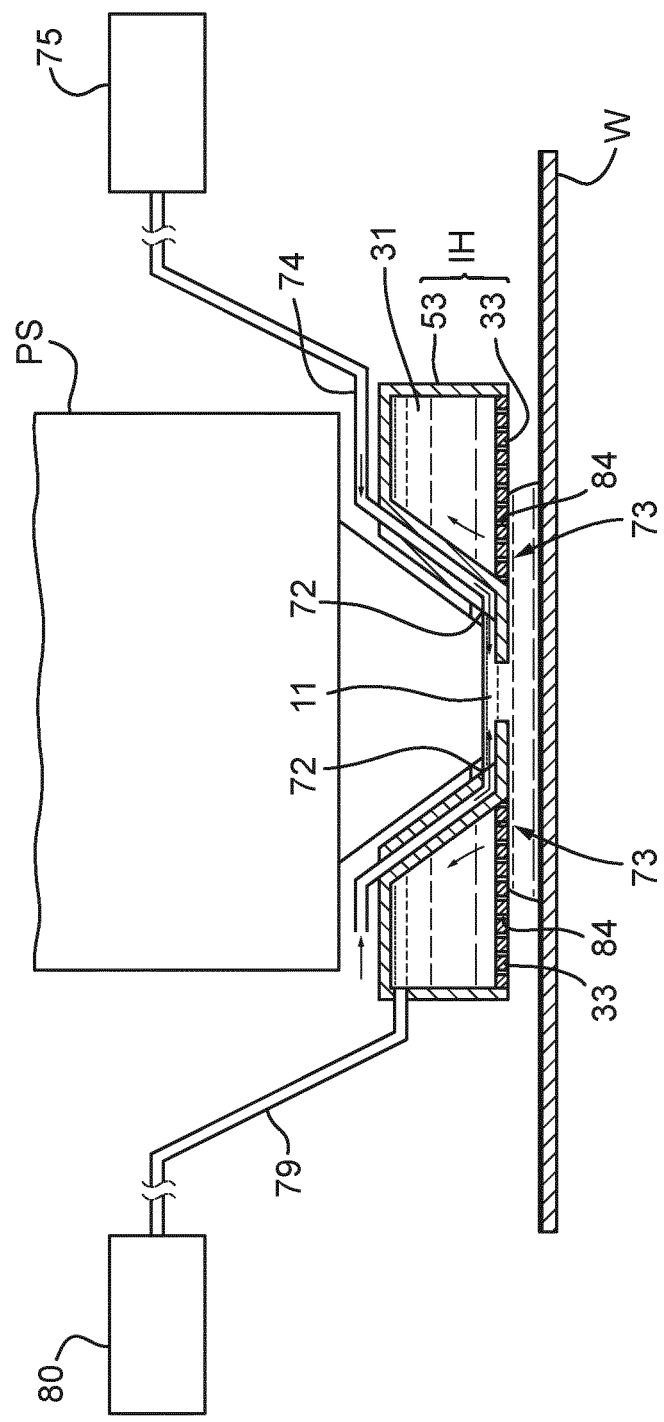

FIG. 3 is a side cross sectional view that depicts a further liquid supply system or fluid handling system according to an embodiment. The arrangement illustrated in FIG. 3 and described below may be applied to the lithographic apparatus described above and illustrated in FIG. 1. The liquid supply system is provided with a fluid handling structure IH (or a liquid confinement structure), which extends along at least a part of a boundary of the space 11 between the final element of the projection system PS and the support table WT or substrate W.

The fluid handling structure IH at least partly confines the immersion liquid in the space 11 between the final element of the projection system PS and the substrate W. The space 11 is at least partly formed by the fluid handling structure IH positioned below and surrounding the final element of the projection system PS. In an example, the fluid handling structure IH comprises a main body member 53 and a porous member 33. The porous member 33 is plate shaped and has a plurality of holes (i.e., openings or pores). In an embodiment, the porous member 33 is a mesh plate wherein numerous small holes 84 are formed in a mesh. Such a system is disclosed in US 2010/0045949 A1, which is hereby incorporated by reference in its entirety.

The main body member 53 comprises supply ports 72, which are capable of supplying the immersion liquid to the space 11, and a recovery port 73, which is capable of recovering the immersion liquid from the space 11. The supply ports 72 are connected to a liquid supply apparatus 75 via passageways 74. The liquid supply apparatus 75 is capable of supplying the immersion liquid to the supply ports 72 through the corresponding passageway 74. The recovery port 73 is capable of recovering the immersion liquid from the space 11. The recovery port 73 is connected to a liquid recovery apparatus 80 via a passageway 79. The liquid recovery apparatus 80 recovers the immersion liquid recovered via the recovery port 73 through the passageway 29. The porous member 33 is disposed in the recovery port 73. Performing the liquid supply operation using the supply ports 72 and the liquid recovery operation using the porous member 33 forms the space 11 between the projection system PS and the fluid handling structure IH on one side and the substrate W on the other side.

Figure 4:
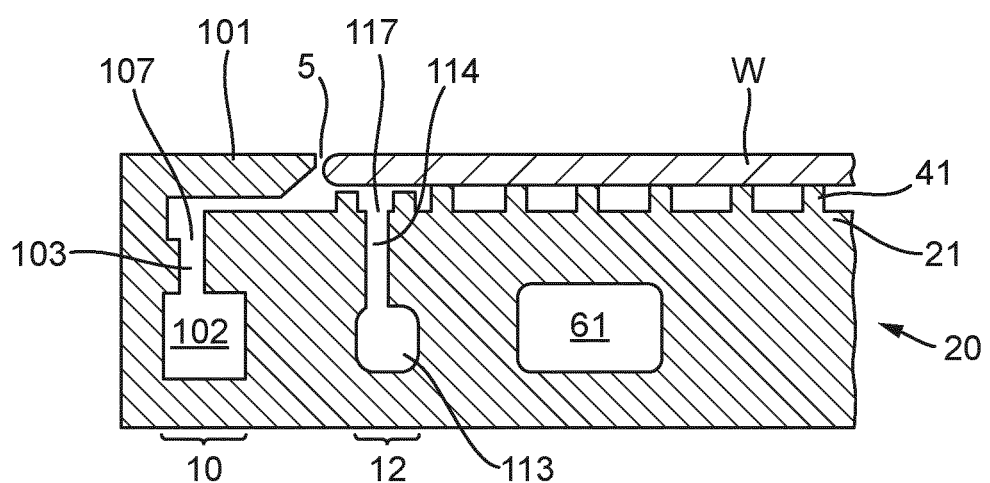
FIG. 4 depicts part of a lithographic apparatus.

FIG. 4 illustrates part of a lithographic apparatus useful for an understanding of an embodiment of the present invention. The arrangement illustrated in FIG. 4 and described below may be applied to the lithographic apparatus described above and illustrated in FIG. 1. FIG. 4 is a cross-section through a substrate support 20 and a substrate W. In an embodiment, the substrate support 20 comprises one or more conditioning channels 61 of a thermal conditioner 60, which is described in more detail below. A gap 5 exists between an edge of the substrate W and an edge of the substrate support 20. When the edge of the substrate W is being imaged or at other times such as when the substrate W first moves under the projection system PS (as described above), the immersion space 11 filled with liquid by the fluid handling structure IH (for example) will pass at least partly over the gap 5 between the edge of the substrate W and the edge of the substrate support 20. This can result in liquid from the immersion space 11 entering the gap 5.

The substrate W is held by a first support body 21 (e.g. a pimple or burl table) comprising one or more projections 41 (i.e., burls). The first support body 21 is an example of an object holder. Another example of an object holder is a mask holder. An under-pressure applied between the substrate W and the substrate support 20 helps ensure that the substrate W is held firmly in place. However, if immersion liquid gets between the substrate W and the first support body 21 this can lead to difficulties, particularly when unloading the substrate W.

In order to deal with the immersion liquid entering that gap 5 at least one drain 10, 12 is provided at the edge of the substrate W to remove immersion liquid which enters the gap 5. In the embodiment of FIG. 4 two drains 10, 12 are illustrated though there may only be one drain or there could be more than two drains. In an embodiment, each of the drains 10, 12 is annular so that the whole periphery of the substrate W is surrounded.

A primary function of the first drain 10 (which is radially outward of the edge of the substrate W/first support body 21) is to help prevent bubbles of gas from entering the immersion space 11 where the liquid of the fluid handling structure IH is present. Such bubbles may deleteriously affect the imaging of the substrate W. The first drain 10 is present to help avoid gas in the gap 5 escaping into the immersion space 11 in the fluid handling structure IH. If gas does escape into the immersion space 11, this can lead to a bubble which floats within the immersion space 11. Such a bubble, if in the path of the projection beam, may lead to an imaging error. The first drain 10 is configured to remove gas from the gap 5 between the edge of the substrate W and the edge of the recess in the substrate support 20 in which the substrate W is placed. The edge of the recess in the substrate support 20 may be defined by a cover ring 101 which is optionally separate from the first support body 21 of the substrate support 20. The cover ring 101 may be shaped, in plan, as a ring and surrounds the outer edge of the substrate W. The first drain 10 extracts mostly gas and only a small amount of immersion liquid.

The second drain 12 (which is radially inward of the edge of the substrate W/first support body 21) is provided to help prevent liquid which finds its way from the gap 5 to underneath the substrate W from preventing efficient release of the substrate W from the substrate table WT after imaging. The provision of the second drain 12 reduces or eliminates any problems which may occur due to liquid finding its way underneath the substrate W.

As depicted in FIG. 4, in an embodiment the lithographic apparatus comprises a first extraction channel 102 for the passage therethrough of a two phase flow. The first extraction channel 102 is formed within a block. The first and second drains 10, 12 are each provided with a respective opening 107, 117 and a respective extraction channel 102, 113. The extraction channel 102, 113 is in fluid communication with the respective opening 107, 117 through a respective passageway 103, 114.

As depicted in FIG. 4, the cover ring 101 has an upper surface. The upper surface extends circumferentially around the substrate W on the first support body 21. In use of the lithographic apparatus, the fluid handling structure IH moves relative to the substrate support 20. During this relative movement, the fluid handling structure IH moves across the gap 5 between the cover ring 101 and the substrate W. In an embodiment the relative movement is caused by the substrate support 20 moving under the fluid handling structure IH. In an alternative embodiment the relative movement is caused by the fluid handling structure IH moving over the substrate support 20. In a further alternative embodiment the relative movement is provided by movement of both the substrate support 20 under the fluid handling structure IH and movement of the fluid handling structure IH over the substrate support 20. In the following description, movements of the fluid handling structure IH will be used to mean the relative movement of the fluid handling structure IH relative to the substrate support 20.

Figure 5:
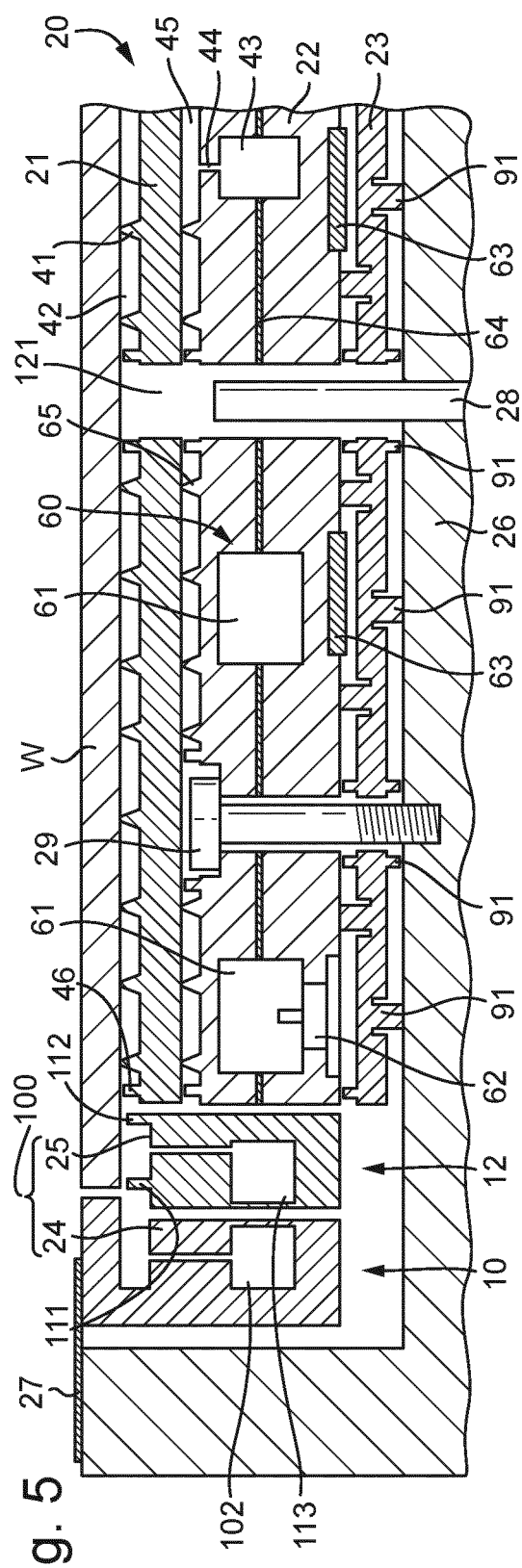
FIG. 5 depicts a substrate support according to an embodiment of the invention.

FIG. 5 is a schematic diagram of a substrate support 20 according to an embodiment of the invention. The substrate support 20 is for supporting a substrate W in the lithographic apparatus (such as the lithographic apparatus shown in FIG. 1). During an exposure process, the substrate W is supported on the substrate support 20. Between exposure processes, the substrate W on the substrate support 20 may be replaced. During this time, the substrate support 20 may not have any substrate W supported on it.

As shown in FIG. 5, in an embodiment the substrate support 20 comprises a first support body 21. The first support body 21 is configured to support the substrate W. When the substrate W is supported by the substrate support 20, the substrate W comes into direct contact with the first support body 21. The first support body 21 is the part of the substrate support 20 that physically supports the underside of the substrate W. As shown in FIG. 5, in an embodiment the first support body 21 comprises a plurality of burls 41. The distal ends of the burls 41 form a plane at which the underside of the substrate W is supported. The underside of the substrate W comes into contact with the distal ends of the burls 41. The burls 41 are at the upper side of the first support body 21.

As shown in FIG. 5, in an embodiment there is a space 42 between the underside of the substrate W and the base surface (between the burls 41) at the upper side of the first support body 21. In an embodiment, the substrate support 20 comprises a clamp configured to hold the substrate W onto the first support body 21. For example, as shown in FIG. 5, in an embodiment the substrate support 20 comprises a clamp comprising a clamp channel 43. The clamp channel 43 is configured to extract gas from the space 42 between the substrate W and the first support body 21. The clamp channel 43 is in fluid communication with the space 42. As shown in FIG. 5, in an embodiment the clamp channel 43 is in fluid communication with the space 42 via one of more clamp passageways 44. In an embodiment, the clamp channel 43 has an annular shape around the center of the substrate support 20. The clamp channel 43 extends circumferentially. In an embodiment, a plurality of clamp passageways 44 extend vertically to connect the clamp channel 43 to the space 42.

As shown in FIG. 5, in an embodiment the substrate support 20 comprises a main body 22. The main body 22 is separate from the first support body 21. The first support body 21 can be separated from the main body 22 without substantially damaging the main body 22. The first support body 21 can be removed from, and placed back onto, the main body 22. The main body 22 is configured to support the first support body 21.

During use of the substrate support 20, the substrate support 20 undergoes wear and tear. For example, the distal ends of the burls 41 wear over time. When the burls 41 are worn, the first support body 21 can be replaced without having to replace the entirety of the substrate support 20. For example, the first support body 21 may be replaced without replacing the main body 22. In an embodiment, the first support body 21 is removed from the main body 22. A replacement first support body 21 is then positioned on the main body 22. Exposure processes are then continued using the replacement first support body 21. An embodiment of the invention is expected to reduce the cost of maintaining usability of the substrate support 20.

It may be quicker to replace the first support body 21 compared to replacing the entirety of the substrate support 20. An embodiment of the invention is expected to reduce the downtime of the lithographic apparatus required in order to maintain the substrate support 20.

As shown in FIG. 5, in an embodiment, the main body 22 comprises a thermal conditioner 60. In an embodiment the thermal conditioner 60 is configured to thermally condition the main body 22. Additionally, or alternatively, the thermal conditioner 60 is configured to thermally condition the first support body 21. Additionally or alternatively, the thermal conditioner 60 is configured to thermally condition the substrate W. By thermally conditioning the main body 22 and/or the first support body 21 and/or the substrate W, the temperature profile can be controlled. In particular, deformations caused by thermal fluctuations can be reduced. By reducing deformations, the accuracy of the exposure processes can be improved.

The way in which the thermal conditioner 60 thermally conditions is not particularly limited. Merely as an example, as shown in FIG. 5 in an embodiment the thermal conditioner 60 comprises one or more conditioning channels 61. The conditioning channels 61 may extend through the main body 22. In an embodiment, the conditioning channels 61 contain a fluid (e.g. a gas and/or a liquid).

As shown in FIG. 1, in an embodiment, the lithographic apparatus comprises a controller 500. In an embodiment the controller 500 is configures to control a flow or fluid through the one of more conditioning channels 61. In an embodiment, the controller 500 is configured to control the flow of fluid through the conditioning channels 61 so as to control the temperature profile of a target body (e.g. the main body 22, the first support body 21 and/or the substrate W).

As shown in FIG. 5, in an embodiment the thermal conditioner 60 comprises one or more sensors 62. In an embodiment, the sensor 62 is attached to the main body 22 or embedded in the main body 22. In an embodiment, the sensor 62 is a temperature sensor. In an embodiment, the sensor 62 may be configured to sense the temperature of fluid flowing in the conditioning channels 61. In an embodiment, a plurality of sensors 62 are provided at different positions along the conditioning channels 61 so as to detect the temperature profile throughout the conditioning channels 61.

As shown in FIG. 5, in an embodiment the thermal conditioner 60 comprises one or more heaters 63. As shown in FIG. 5, in an embodiment the heaters 63 are attached at the underside of the main body 22. However, heaters 63 may be positioned at other surfaces of the main body 22 or the first support body 21. Additionally or alternatively, sensors may be provided at the surfaces of the main body 22 and/or the first support body 21. In an embodiment, the controller 500 is configured to receive signals from the sensors 62 and subsequently control the heaters 63 and/or a flow of fluid through the conditioning channels 61.

In the substrate support 20, the function of physical supporting (and clamping) the substrate W is performed by the first support body 21. Meanwhile, the function of thermally conditioning is performed by the main body 22. The first support body 21 is separate from the main body 22. The functions of supporting the substrate W and thermal stabilization are separated into different components. When one function fails (or is no longer performed to the required standard), then the corresponding component can be replaced without having the replace the other component. An embodiment of the invention is expected to make it easier to maintain the substrate support 20 so that the functions performed by it are performed to the required standard.

As shown in FIG. 5, in an embodiment the substrate support 20 comprises an extractor body 100. The extractor body 100 surrounds the main body 22 and the first support body 21. The extractor body 100 is radially outwards of the main body 22 and the first support body 21. As shown in FIG. 5, in an embodiment the extractor body 100 is provided in a component which is separate from the main body 22. However, it is not essential for the extractor body 100 to be separate from the main body 22 and the first support body 21. As will be described in more detail below, the extractor body 100 may be part of the same component as the main body 22. In such an embodiment, the extractor body 100 cannot be replaced without also replacing the main body 22 (and vice versa). In an embodiment, for example, as shown in FIGS. 7 to 10, the extractor body 100 is part of the same component as the main body 22. The extractor body 100 may be integrally formed with the main body 22. The extractor body 100 and the main body 22 are formed together as one component. The extractor body 100 and the main body 22 cannot be disconnected from each other. In an alternative embodiment, the extractor body 100 is integrally formed with the substrate stage 26.

As shown in FIG. 5, in an embodiment the extractor body 100 comprises a first extraction channel 102. In an embodiment, an extractor body 100 comprises the first drain 10 described above. The first extraction channel 102 is configured to extract fluid from near a peripheral part of the substrate W. As shown in FIG. 5, in an embodiment the first extraction channel 102 is configured to extract fluid from radially outwards of the peripheral edge of the substrate W. The first extraction channel 102 is configured to remove bubbles that may otherwise be present in the immersion liquid used in the lithographic apparatus. The first extraction channel 102 helps to reduce image defects by reducing bubbles and/or by reducing the generation of watermarks for example.

As explained above, the extractor body 100 is configured to reduce defectivity issues. The function performed by the extractor body 100 may be different from the function performed by the first support body 21 and the main body 22. When one of the functions fails, or is no longer performed to the required standard, the corresponding component (e.g. the extractor body 100 or the first support body 21 or the main body 22) can be replaced without replacing the other components of the substrate support 20.

Figure 6:
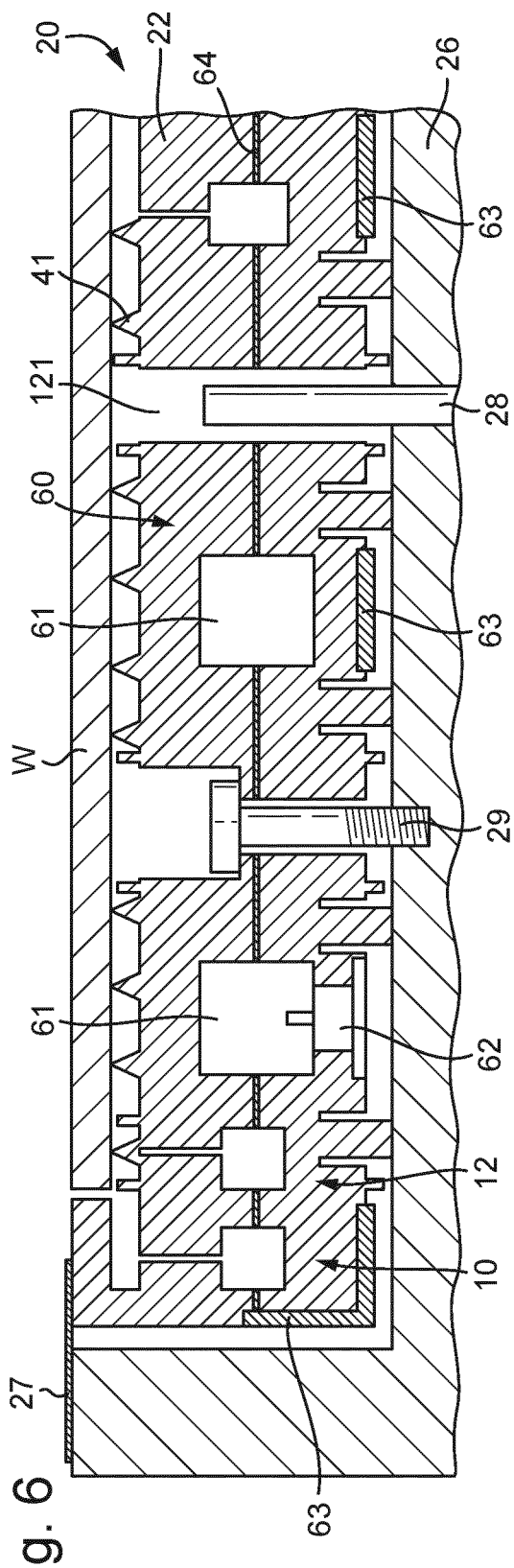
FIG. 6 depicts a substrate support according to a comparative example.

FIG. 6 schematically depicts a substrate support 20 according to a comparative example. In the comparative example shown in FIG. 6, both the function of supporting (and clamping) the substrate W and thermally conditioning the substrate W are performed in the same component. Accordingly, when the tips of the burls 41 wear out, the entire main body 22 including both of the thermal conditioner 60 and the burls 41 that support the substrate W has to be replaced. This is necessary even if, for example, the thermal conditioner 60 is still in good order and does not need to be replaced.

As shown in FIG. 5, in an embodiment a seal member 27 is provided to seal a gap between the substrate support 20 and the substrate stage 26 that supports the substrate support 20. In the comparative example shown in FIG. 6, when the substrate support 20 is replaced, it is also necessary to remove and replace the seal member 27. In contrast, in the embodiment shown in FIG. 5, the extractor body 100 and the seal member 27 may remain in place while the first support body 21 and/or main body 22 is replaced. Similarly, the embodiments in which the extractor body 100 is part of the same component as the main body 22, the extractor body 100 and the seal member 27 can remain in place while the first support body 21 is replaced. An embodiment of the invention is expected to reduce the time required to maintain the substrate support 20.

As shown in FIG. 5, in an embodiment the substrate support 20 comprises a second support body 23. The second support body 23 is separate from the main body 22. The second support body 23 is configured to support the main body 22 on the substrate stage 26. In an embodiment, the main body 22 comes into physical contact with the second support body 23. For example, in an embodiment the underside of the main body 22 is supported on top of the second support body 23. The second support body 23 is supported on the substrate stage 26.

As shown in FIG. 5, in an embodiment the second support body 23 comprises a plurality of burls 91. In an embodiment, the burls 91 of the second support body 23 are longer than the burls 41 of the first support body 21. The burls 91 protrude at the underside of the second support body 23. These burls 91 extend towards the substrate stage 26 and are supported by the substrate stage 26. In an embodiment, the second support body 23 is configured to reduce relative movement between the substrate support 20 and the substrate stage 26. The second support body 23 is configured to reduce slipping between the substrate support 20 and the substrate stage 26. During use of the lithographic apparatus, the substrate stage 20 may undergo high accelerations. If the substrate support 20 slips relative to the substrate stage 26, then this can lead to undesirable overlay errors. The burls 91 are configured to grip relative to the substrate stage 26 so as to reduce slipping of the substrate support 20 relative to the substrate stage 26.

The second support body 23 can be physically separated from the main body 22 without damaging the main body 22 or the second support body 23. It is possible to replace one or the other of the main body 22 and the second support body 23 without replacing the other. For example, if the anti-slip function of the second support body 23 is no longer being performed to the required standard, then the second support body 23 can be replaced without replacing the main body 22. An embodiment of the invention is expected to reduce the cost for maintaining the substrate support 20.

In another example, the main body 22 may be replaced if, for example, the thermal conditioner 60 needs to be replaced. The main body 22 can be replaced without replacing (or even substantially moving) the second support body 23. An embodiment of the invention is expected to reduce the cost of maintaining the substrate support 20.

However, it is not essential for the substrate support 20 to comprise such a second support body 23. For example, as shown in FIGS. 7 to 12, the function of reducing slipping of the substrate support 20 relative to the substrate stage 26 may be performed by the main body 22. The burls 91 may be provided at the bottom of the main body 22.

As shown in FIGS. 5 and 7, for example, in an embodiment the main body 22 comprises at its upper side a plurality of burls 65. The burls 65 have distal ends in a plane. The burls 65 are configured to support the first support body 21. By providing the burls 65 of the upper side of the main body 22, the structure of the first support body 21 is kept simple. The underside of the first support body 21 can be flat and substantially featureless. The upper side of the first support body comprises the burls 41 for supporting the substrate W. An embodiment of the invention is expected to make it cheaper to manufacture the component that clamps the substrate W.

Additionally, as shown in FIGS. 5 and 8 to 10, for example, in an embodiment the first support body 21 comprises a plurality of seal protrusions 46. The seal protrusions 46 protrude at the upper side of the first support body 21. The seal protrusions 46 are shorter than the burls 41. The seal protrusions 46 do not come into contact with the substrate W. A small gap is present between the top of the seal protrusions 46 and the underside of the substrate W. In an embodiment, the seal protrusions 46 extend circumferentially around the first support body 21, i.e., the seal protrusions 46 form respective rings. The seal protrusions 46 are configured to reduce the amount of fluid passing across the seal protrusions 46.

However, it is not essential for the main body 22 to be provided with the burls 65. For example, in an alternative embodiment shown in FIG. 8, the first support body 21 comprises at its lowest side a plurality of burls 47. The burls 47 have distal ends in a plane. The burls 47 are configured to contact the upper side of the main body 22. As shown in FIG. 8, instead of the burls 65 being provided on the main body 22, a different set of burls 47 may be provided at the bottom side of the first support body 21. During use, it may be that the burls 41, 47 wear out before other parts of the substrate support 20 wear out. By providing both sets of burls 41, 47 on the first support body 21, the burls can be replaced simply by replacing the first support body 21 without needing to replace the main body 22. An embodiment of the invention is expected to reduce the cost of maintaining the substrate support 20.

As shown in FIG. 5, in an embodiment the extractor body 100 comprises a second extraction channel 113. This is also shown in other Figures. The second extraction channel 113 is part of the second drain 12. In an embodiment, the second extraction channel 113 is configured to extract fluid from radially inward of the first extraction channel 102. In an embodiment, the second extraction channel 113 is provided to keep liquid from flowing under the substrate W. However, it is not essential for such a second extraction channel 113 to be provided. For example, FIG. 10 shows an embodiment that does not have the second extraction channel 113.

In an embodiment, the second extraction channel 113 is configured to extract fluid from below the peripheral part of the substrate W so as to prevent liquid from reaching the space 42 between the central part of the substrate W and the first support body 21. As shown in FIG. 4, in an embodiment the second extraction channel 113 is connected to the space below the peripheral part of the substrate W via one or more second passageways 114. In an embodiment, the second extraction channel 113 extends circumferentially around the substrate support 20. In an embodiment, a plurality of second passageways 114 are provided. The second passageways 114 extend vertically between the second extraction channel 113 and just below the peripheral part of the substrate W.

As shown in FIG. 5, in an embodiment the second extraction channel 113 is spaced apart from the first extraction channel 102 by an open gap. The first extraction channel 102 and the second extraction channel 113 may be provided in separate bodies 24, 25. The separate bodies 24, 25 can be separated from each other without destroying either of the bodies 24, 25. The functions of reducing defectivity issues (performed by the first extraction channel 102) and keeping liquid from flowing under the substrate W (performed by the second extraction channel 113) may be performed by separate bodies 24, 25. It is possible to replace one of the bodies 24, 25 without replacing the other. An embodiment of the invention is expected to reduce the cost of maintaining the substrate support 20.

As shown in FIG. 7 (and also visible in FIGS. 5 and 8, for example), in an embodiment the substrate support 20 comprises an inner seal 112 and an outer seal 111. The inner seal 112 is positioned radially inward of the openings through which the second extraction channel 113 extracts fluid. The outer seal 111 is positioned radially outward of the openings through which the second extraction channel 113 extracts fluid. The inner seal 112 and the outer seal 111 protrude towards the underside of the substrate W. The inner seal 112 and the outer seal 111 do not protrude far enough to come into contact with the substrate W in use with the substrate support 20. Instead, a small gap is present between the tops of the inner seal 112 and the substrate W as well as between the top of the outer seal 111 and the substrate W. The inner seal 112 and the outer seal 11 are configured such that in use liquid may be present between the seal 111, 112 and the substrate W. This helps to prevent liquid from reaching below the substrate W in a central part of the substrate W.

As shown in FIG. 9, in an embodiment the function of the inner seal 112 is performed by a seal protrusion 46 at the upper side of the first support body 21. This is an alternative to the arrangement shown in FIG. 7, for example, where the inner seal 112 is provided as a protrusion at the upper side of the main body 22. As shown in FIG. 9, in an embodiment an upper passageway 49 is provided through the first support body 21. The upper passageway 49 connects with the second passage way 114 so that fluid can be extracted from below the peripheral substrate W into the second extraction channel 113.

As shown in FIG. 9, for example, in an embodiment the main body 22 comprises a seal protrusions 66. The seal protrusions 66 are configured to reduce the possibility of moisture reaching the upper surface of the main body 22. This reduces oxidation of the main body 22.

As shown in FIG. 10, in an embodiment the substrate support 20 is not provided with the second extraction channel 113 shown in FIGS. 5 to 9 for example. As shown in FIG. 10, in an embodiment an open gap or a flow passage 115 is formed between the extractor body 100 and main body 22 and the first support body 21. In an embodiment, the open gap or the flow passage 115 is in fluid communication with ambient pressure or a pressure source. In an embodiment, a plurality of flow passages 115 extend mainly vertically through the main body 22 (which may be part of the same component as the extractor body 100). In an alternative embodiment, an open gap may extend circumferentially around the main body 22, with the extractor body 100 provided as a separate component from the main body 22. In an embodiment, a flow of gas passes through the open gap or flow passage 115. The flow of gas passes over the seal protrusion 46 of the upper peripheral edge of the first support body 21. By providing the gas flow, the possibility of liquid reaching the underside of the substrate W over the seal protrusion 46 may be reduced. It may not be necessary to provide the second extraction channel 113. An embodiment of the invention is expected to reduce the complexity of the substrate support 20. An embodiment of the invention is expected to make it easier to manufacture the substrate support 20.

As described above and shown in FIGS. 5 and 7 to 10, the substrate support 20 can be modularized in various ways. As shown in FIG. 11, in an embodiment an extractor body 100 is provided with both the first extraction channel 102 and the second extraction channel 113. The extractor body 100 is separate from both the first support body 21 and the main body 22. The main body 22 is supported directly on the substrate stage 26 (i.e. without the second support body 23). As shown in FIG. 11, the inner seal 112 and the outer seal 111 are provided as part of the extractor body 100. This reduces the radial dimension of the first support body 21 (because the first support body 21 does not require an additional seal protrusion 46 to perform the function of the inner seal 112). This reduces the amount of the substrate support 20 that is replaced when it is necessary to replace worn out burls 41.

As shown in FIG. 11, in an embodiment the main body 22 extends below the extractor body 100. The lower side of the extractor body 100 is coupled to the main body 22. This makes it easier to control the height of the extractor body 100 relative to the first support body 21. By controlling the height of the extractor body 100 more precisely, the sealing function provided by the inner seal 112 and the outer seal 111 is more reliable.

As shown in FIG. 11, in an embodiment one or more holes 119 are provided in the main body 22. The holes 119 are configured to be in fluid communication with the gap between the radially inner part of the extractor body 100 and the main body 22. The holes 119 may connect to other holes extending through the substrate stage 26. The holes 119 are configured to provide ambient or pressurized gas. By providing a gas flow up through the holes 119, the possibility of liquid reaching below the central part of the substrate W is reduced. By providing the gas flow through the holes 119, humidity transfer to the first support body 21 is reduced. By reducing humidity transfer to the first support body 21, oxidation of the first support body 21 is reduced.

In an embodiment, the holes 119 are configured to provide pressurized gas. By providing a pressurized flow of gas, it is possible to control lifting of the edge of the substrate W. By controlling lifting of the outer edge of substrate W, wear on the outermost burl 41 of the first support body 21 can be reduced. An embodiment of the invention is expected to reduce wear of the substrate support 20.

As shown in FIG. 11, in an embodiment an adhesive layer 104 is provided between the extractor body 100 and the main body 22. The adhesive layer 104 fixes the extractor body 100 to the main body 22. This makes it easier to control the gap from the substrate W to the inner seal 112 and the outer seal 111 of the extractor body 100.

In an embodiment, beads are dispersed in the adhesive layer 104. For example, glass beads may be dispersed in a glue. The beads can be chosen in size so as to provide the required height step between the tops of the inner/outer seals 111, 112 and the top of the seal protrusion 66 at the radially outward part of the top surface of the main body 22. In an embodiment, the beads have a diameter of, for example, 45 microns, 50 microns or 55 microns.

As shown in FIG. 11, in an embodiment fluid connection is maintained from the first/second extraction channels 102, 113 through the main body 22 (on which the extractor body 100 is attached) and subsequently through the substrate stage 26. The fluid connection may be maintained by dog bone connectors 105 and rings 106. However, the connection between the extractor body 100 and the main body 22 for the purposes of the first/second extraction channels 102, 113 is not particularly limited.

Figure 12:
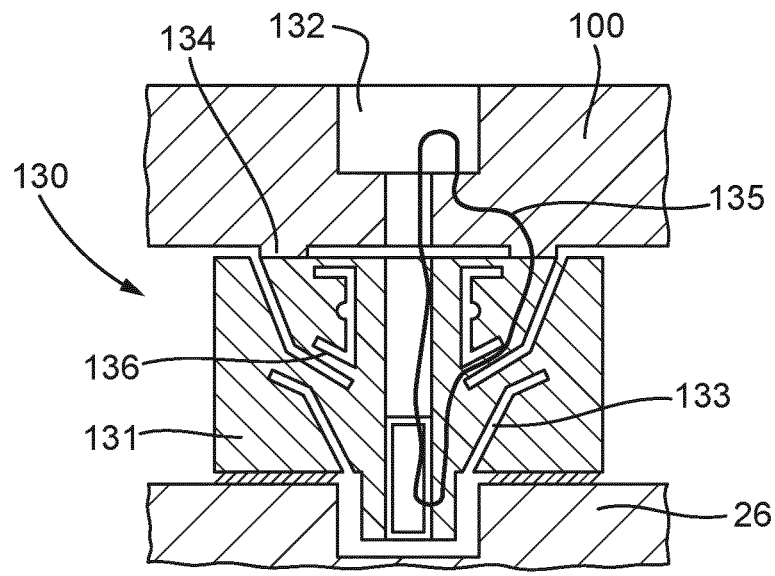
FIGS. 12 and 13 depicts different versions of a height adjustment mechanism for an embodiment of the invention.
Figure 13:
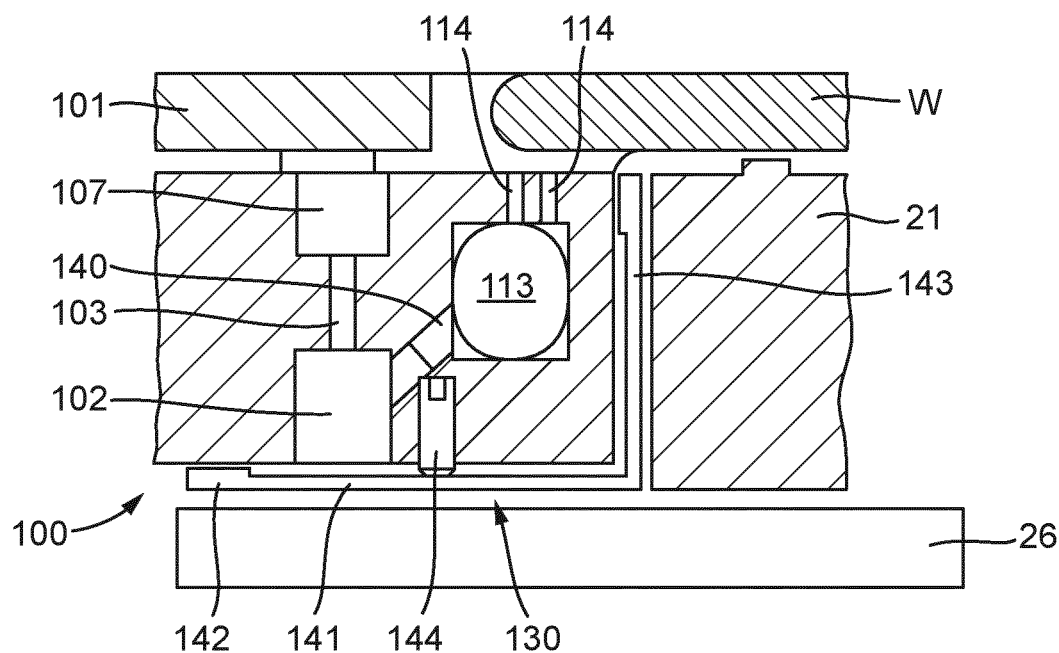

It is not essential for the main body 22 to extend below the extractor body 100. In an alternative embodiment, the lower side of the extractor body 100 is attached to the substrate stage 26. In an embodiment, the substrate table WT (which comprises the substrate stage 26 and the substrate support 20) comprises a height adjustment mechanism 130. Alternative versions of a height adjustment mechanism 130 are shown in FIGS. 12 and 13, for example. The height adjustment mechanism 130 is configured to provide for fine-tunable height adjustment so as to obtain the right seal gap between the extractor body 100 and the substrate W. The height adjustment mechanism 130 is configured to control the height of at least part of the extractor body 100 below the substrate W such that the extractor body 100 is configured to prevent liquid from reaching between the central part of the substrate W and the first support body 21.

As shown in FIG. 12, in an embodiment the height adjustment mechanism 130 comprises an insert member 131. The insert member 131 is a block of material. The insert member 131 is provided between the lower side for the extractor body 100 and the substrate stage 26. The insert member 131 is separate from the main body 22. The insert member 131 is the component through which the extractor body 100 is attached to the substrate stage 26.

As shown in FIG. 12, in an embodiment the height adjustment mechanism 130 comprises a fastener 132. For example, in an embodiment the fastener 132 is a bolt. As shown in FIG. 12, in an embodiment the fastener 132 does not reach through to the substrate stage 26. The fastener 132 connects the extractor body 100 to the insert member 131.

As shown in FIG. 12, in an embodiment the extractor body 100 comprises protrusions 134 configured to engage with the insert member 131. As shown in FIG. 12, in an embodiment the insert member 131 is glued onto the substrate stage 26.

As shown in FIG. 12, in an embodiment the insert member 131 is structured with cut-out sections 133 such that the insert member 131 compresses when the fastener 132 fastens the extractor body 100 to the insert member 131. The compression of the insert member 131 can be controlled so as to control the height of the top of the extractor body 100 below the substrate W. In particular, the force supplied by the fastener 132 can be controlled so as to control compression of the insert member 131.

FIG. 12 shows the force line 135 of reaction forces that pass through the fastener 132 and through solid parts (i.e. between cut-out sections 133) of the insert member 131. As shown in FIG. 12, the cut-out sections 133 may be arranged so that the force line 135 extends through a relatively narrow section of the insert member 131. The narrow section of the insert member 131 may be relatively flexible, thereby making it easier for the insert member 131 to be compressed in a controlled way. This helps to control the height of the extractor body 100 below the substrate W. In particular, narrow sections of the insert member 131 between cut-out sections 133 may function as leaf springs (or other flexures).

The height adjustment mechanism 130 shown in FIG. 12 is only one example. As another example, an alternative height adjustment mechanism 130 is shown in FIG. 13. As shown in FIG. 13, in an embodiment the extractor body 100 comprises a leaf spring 141. The leaf spring 141 comprises a lower part 142 fixed to the rest of the extractor body 100. The leaf spring 141 further comprises an upper part 143 that extends between the extractor body 100 and the first support body 21. In an embodiment, a plurality of such leaf springs 141 are provided circumferentially around the substrate support 20. In an alternative embodiment, a single leaf spring 141 extends circumferentially around the substrate support 20.

As shown in FIG. 13, in an embodiment the height adjustment mechanism 130 is configured to control the height of the upper part 143 below the substrate W such that the upper part 143 is configured to prevent liquid from reaching between a central part of the substrate W and the first support body 21. In an embodiment, a set screw 144 is provided to allow for fine adjustment of the leaf spring 141. The set screw 141 can protrude a controlled distance below the extractor body 100. As the set screw 144 protrudes further from the bottom of the extractor body 100, the set screw 144 forces the leaf spring 141 to bend, thereby lowering the height of the upper part 144 of the leaf spring 141. As shown in FIG. 13, in an embodiment the first extraction channel 102 may be connected with the second extraction channel 113 via a connecting channel 140.

The way in which the thermal conditioner 60 is arranged in the main body 22 is not particularly limited. In an embodiment, the thermal conditioner 60 is attached at an under surface of the main body 22. For example, one of more Peltier elements and/or heaters may be provided at the lower surface of the main body 22 and/or the extractor body 100. Additionally or alternatively, the channels 61, one of more Peltier elements and/or heaters 63 may be provided externally around the bottom of the main body 22. In an alternative embodiment the thermal conditioner 60 is attached at an upper side of the main body 22. The external channels 61 and/or one or more Peltier elements and/or heaters 63 may be attached (e.g. glued onto the main body 22). In an embodiment, the channels 61, heaters 63 and/or sensor 62 are arranged in the substrate stage 26. At least part of the thermal conditioning function is performed by the substrate stage 26. This helps to simplify the design of the main body 22. In an embodiment, the burls 91 are provided as part of the substrate stage 26. The main body 22 is not required to comprise the burls 91. The underside of the main body 22 may be substantially flat. In an embodiment, at least one sensor 62 is provided in a respective burl 91 of the substrate stage 26. The sensor 62 is configured to sense a temperature of the main body 22. The sensor 62 is positioned close to the main body 22. In an embodiment, at least one heater 63 is provided at a surface of the substrate stage 26 facing the main body 22. In an embodiment, the heater 63 is paired with a respective sensor 62. The heater 63 is positioned adjacent to the respective sensor 62. In an embodiment, the heater 63 is controlled based on output from the paired sensor 62.

As shown in FIG. 5, in an embodiment the clamping channel 43 is in fluid communication with the space 42 via another space 45 between the main body 22 and the first support body 21.

As shown in FIG. 5, in an embodiment the substrate support 20 is locked relative to the substrate stage 26 by at least one locking bolt 29. In an embodiment, the locking bolt 29 is configured to function as a safety lock that prevents the substrate support 20 from falling out from the substrate stage 26. However, the burls 91 perform the function of preventing slipping of the substrate support 20 relative to the substrate stage 26.

As shown in FIG. 5, in an embodiment one of more pins 28 may be used to lower the substrate W onto the first support body 21. The pins 28 extend through respective pin holes 121 in the substrate support 20 and support the substrate W so as to control the height of the substrate W above the first support body 21 during loading and unloading sequences.

As shown in FIG. 7, in an embodiment the main body 22 is formed in two parts that are attached together at a bonding line 64. For example, a bonding material may be used.

As mentioned above, the first support body 21 can be replaced without also replacing the other parts of the substrate holder 20. As shown in the Figures, the first support body 21 has a generally similar shape to that of the substrate W. In an embodiment, the lithographic apparatus comprises at least one handling tool configured to move the substrate W, for example to move the substrate W between different sections of the lithographic apparatus and/or to move the substrate W into or out from the lithographic apparatus. In an embodiment, the same handling tool(s) can be used to control movement of the first support body 21.

Figure 14:
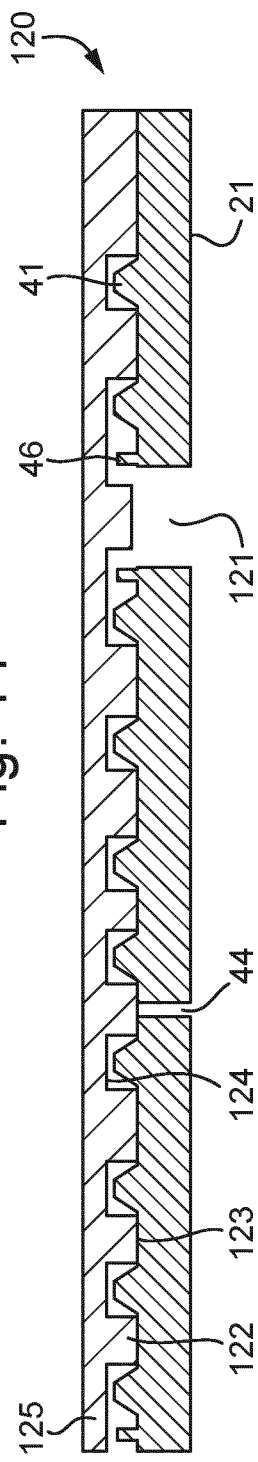
FIG. 14 is a schematic cross-sectional view of a carrier plate connected to a first support body according to an embodiment of the invention.

FIG. 14 is a schematic cross-sectional view of a carrier plate 120 coupled to a first support body 21 according to an embodiment of the invention. The carrier plate 120 is configured to be couplable to the first support body 21. The carrier plate 120 is configured to be releasable (decouplable) from the first support body 21. As shown in FIG. 14, in an embodiment the carrier plate 120 is configured to cover the pin holes 121 in the first support body 21 when the carrier plate 120 is coupled to the first support body 21.

Figure 15:
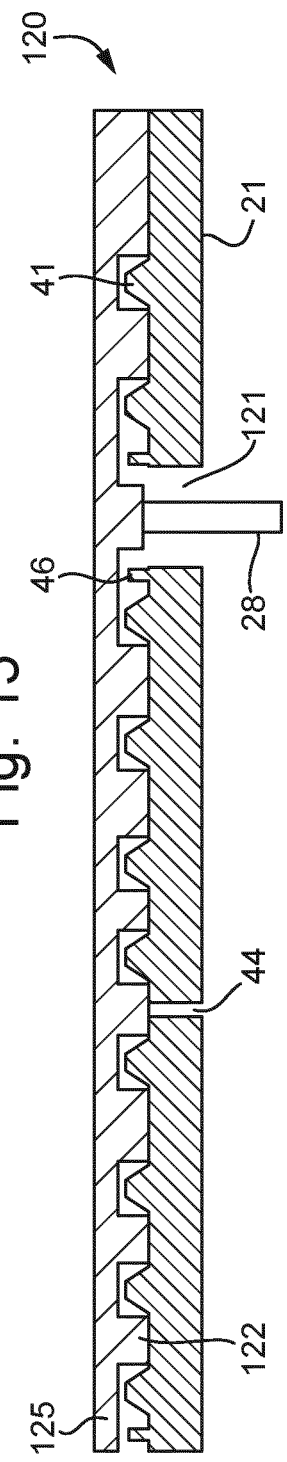
FIG. 15 is a schematic cross-sectional view of the assembly shown in FIG. 14 lowered onto a main body according to an embodiment of the invention.

As mentioned above, in an embodiment a plurality of pins 28 support the substrate W and can be controlled to control lowering of the substrate W onto the substrate support 20. FIG. 15 shows the assembly of the carrier plate 120 and first support body 21 supported by the pins 28. By providing that the carrier plate 120 covers the pin holes 121, the pins 28 can effectively support the first support body 21 via the carrier plate 120 because the first support body 21 is effectively coupled to the carrier plate 120. An embodiment of the invention is expected to make it easier and/or to replace the first support body 21. An embodiment of the invention is expected to reduce downtime of the lithographic apparatus. It is not essential for the carrier plate 120 to be provided. In an alternative embodiment (described in more detail below), alternatives to the pins 28 are provided for controlling movement of the first support body 21.

Figure 16:
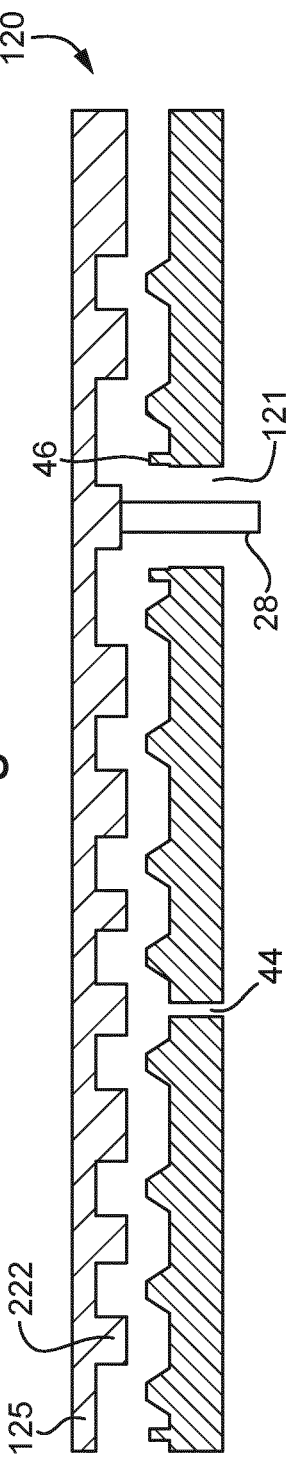
FIG. 16 is a schematic cross-sectional view of the carrier plate being separated from the first support body shown in FIGS. 14 and 15.

The pins 28 can be controlled so as to lower the first support body 21 onto the rest of the substrate support 20 because the first support body 21 and the carrier plate 120 are coupled together. Once the first support body 21 is mounted onto the rest of the substrate support 20, the carrier plate 120 can be removed. FIG. 16 schematically shows the carrier plate 120 decoupled and removed from the first support body 21. In an embodiment, an overpressure is applied through opening 44 to help release the carrier plate 120 from the first support body 21. The carrier plate 120 can be lifted away from the first support body 21 by the pins 28. In an embodiment, the carrier plate 120 can then be moved using the same handling tool(s) used to handle the substrate W.

As shown in FIGS. 14 to 16, in an embodiment the carrier plate 120 comprises a plurality of connection protrusions 122. The connection protrusions 122 are configured to protrude from a base plate 125 of the carrier plate 120 towards the first support body 21. The carrier plate 120 comprises the base plate 125 and the connection protrusions 122. The base plate 125 is flat. In an embodiment the base plate 125 and the connection protrusions 122 are formed of the same material. The base plate 125 is formed integrally with the connection protrusions 122 to form the carrier plate 120. As shown in FIG. 14, in an embodiment the connection protrusions 122 limit how close the base plate 125 can get to the first support body 21. As shown in FIG. 14, in an embodiment the connection protrusions 122 have an abutment surface 123. The abutment surface 123 is configured to abut the first support body 21 directly or via a bonding material.

By providing the connection protrusions 122, the distal ends of the burls 41 do not come into contact with the carrier plate 120. The carrier plate 120 is supported by the first support body 21 between the burls 41 at the upper side of the first support body 21 with the distal ends of the burls 41 at the upper side of the first support body 21 being spaced from the carrier plate 120. An embodiment of the invention is expected to prevent further wear of the burls 41.

Figure 17:
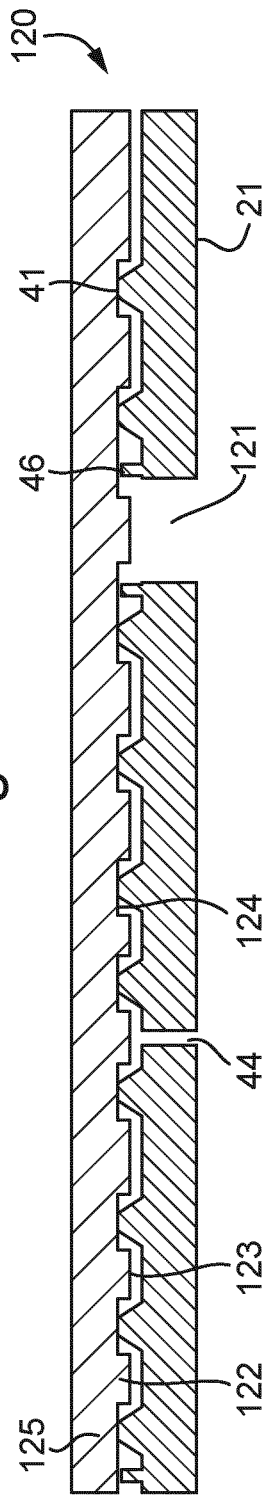
FIG. 17 is a schematic cross-sectional view of a carrier plate connected to a first support body according to an embodiment of the invention.

FIG. 17 is a schematic view of a carrier plate 120 according to an embodiment of the invention. As depicted in FIG. 17, in an embodiment the carrier plate 120 is sufficiently flat at its surface facing the first support body 21 at the distal ends of the burls 41 at the upper side of the first support body 21 supports the carrier plate 120 when the carrier plate 120 is coupled to the first support body 21. As shown in FIG. 17, in an embodiment the connection protrusions 122 do not limit how close the carrier plate 120 can get to the first support body 21. Instead, the distal ends of the burls 41 support the carrier plate 120. The distal ends of the burls 41 contact the base plate surface 124 either directly or via a bonding material.

As shown in FIGS. 14 and 15, in an embodiment only a part of the carrier plate 120 is brought into contact with the first support body 21. This limits the adhesion force, thereby making separation of the carrier plate 120 and the first support body 21 easier.

Figure 19:
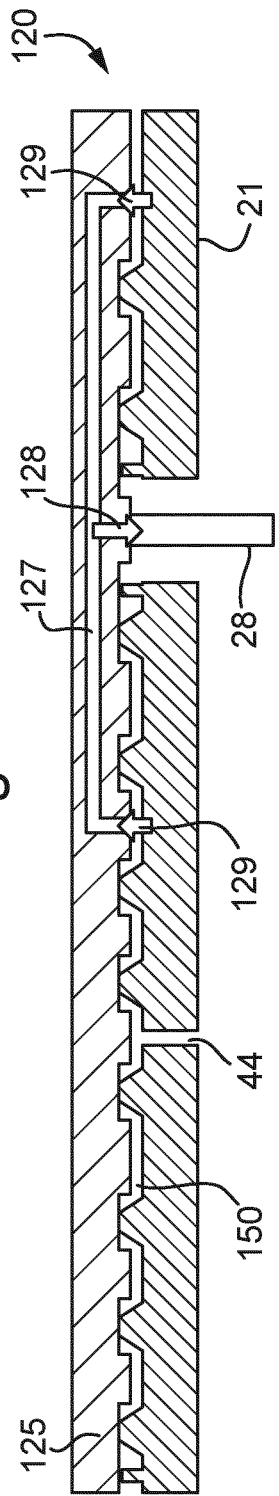
FIG. 19 is a schematic cross-sectional view of a carrier plate connected to a first support body according to an embodiment of the invention.

As shown in FIGS. 17 and 19, for example, it is not essential for the carrier plate 120 to contact the surface of the first support body 21 between the burls 41. In an embodiment, the surface between the burls 41 is rough, such that adhesion forces are limited. By not requiring contact with the rough surface between the burls 41, the rough surface does not adversely affect the carrier plate 120 being coupled to the first support body 21.

In the arrangement shown in FIG. 17, the distal ends of the burls 41 contact the carrier plate 120. One reason for the first support body 21 being replaced is that the burls may have worn. The distal ends of the burls 41 may be particularly smooth when the first support body 21 is required to be replaced. The distal ends of the burls 41 may allow good adhesion to the carrier plate 120, particularly for unloading a first support body 21.

Figure 18:
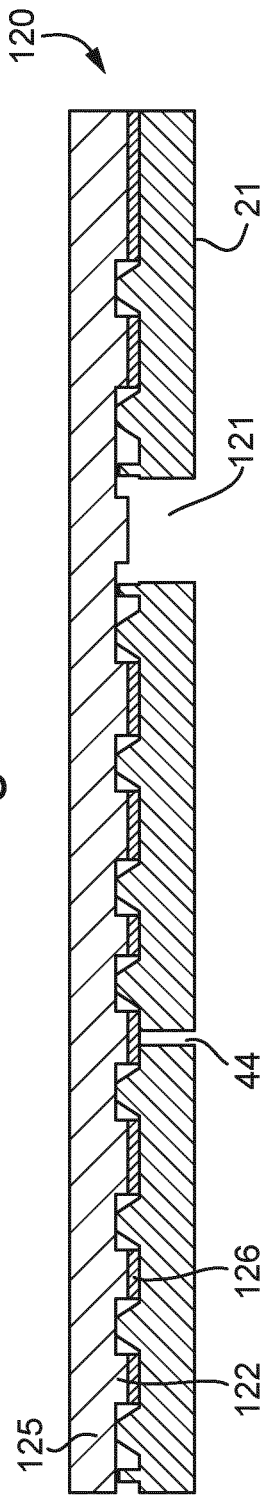
FIG. 18 is a schematic cross-sectional view of a carrier plate connected to a first support body according to an embodiment of the invention.

The way that the carrier plate 120 is coupled to the first support body 21 is not particularly limited. FIG. 18 schematically shows use of a bonding material 126 to couple the carrier plate 120 to the first support body 21. As shown in FIG. 18, in an embodiment a bonding material 126 is provided between the first support body 21 and the abutment surface 123 of the connection protrusions 122. Additionally or alternatively, bonding material 126 can be provided between the distal ends of the burls 41 and the base plate surface 124.

The bonding material 126 is for temporarily bonding the carrier plate 120 to the first support body 21 when the carrier plate 120 is coupled to the first support body 21. The bonding material 126 is not particularly limited. In an embodiment, the bonding material 126 comprises an adhesive material. In an alternative embodiment, a layer of liquid (e.g. water) is provided in place of the bonding material 126. Capillary pressure can be used to keep the carrier plate 120 coupled to the first support body 21.

In the arrangement shown in FIG. 17, an adhesive material may be applied to the base plate surface 124 in the recesses. By limiting the adhesive material to the recesses, the possibility of the adhesive material undesirably contacting other components is reduced.

As shown in FIG. 19, additionally or alternatively, the carrier plate 120 is clamped to the first support body 21 by pressure. In an embodiment the carrier plate 120 comprises at least one internal channel 127. The internal channel 127 is for fluidly connecting a first opening 128 to at least one second opening 129. The first opening 128 and the second opening 129 are at the surface of the carrier plate 120. As shown in FIG. 19, in an embodiment the first opening 128 is at a position where the carrier plate 120 covers one of the pin holes 121 when the carrier plate 120 is coupled to the first support body 21.

The second opening 129 is at a position where the carrier plate 120 faces the first support body 21 at its upper side. In an embodiment, the first opening 128 can be connected to an underpressure so as to cause a flow of gas through the internal channel 127 from the second opening 129 to the first opening 128 and out through the first opening 128. This can reduce the pressure in the region between the carrier plate 120 and the first support body 21 when the carrier plate 120 is coupled to the first support body 21. The carrier plate 120 and the first support body 21 can be held together as a result of the surrounding pressure being greater than the pressure between the carrier plate 120 and the first support body 21.

As shown in FIG. 19, in an embodiment the first opening 128 is at a position that corresponds to the pin 28 that supports the carrier plate 120. In an embodiment, the pin 28 comprises a channel for extracting fluid from the internal channel 127 through the first opening 128. The number of second openings 129 is not particularly limited. The number of internal channels 127 is not particularly limited. In an embodiment, a first opening 128 is provided for each respective pin hole 121.

In an embodiment, the carrier plate 120 comprises an electrically conductive material and an insulating layer configured to electrically insulate the electrically conductive material from the first support body 21 when the carrier plate 120 is connected to the first support body 21. The electrically conductive material can be at a potential difference relative to the first support body 21. Electrostatic attraction between the carrier plate 120 and the first support body 21 can help to couple the carrier plate 120 to the first support body 21. In an embodiment, the insulating layer is provided as a thin layer surrounding the carrier plate 120.

Figure 20:
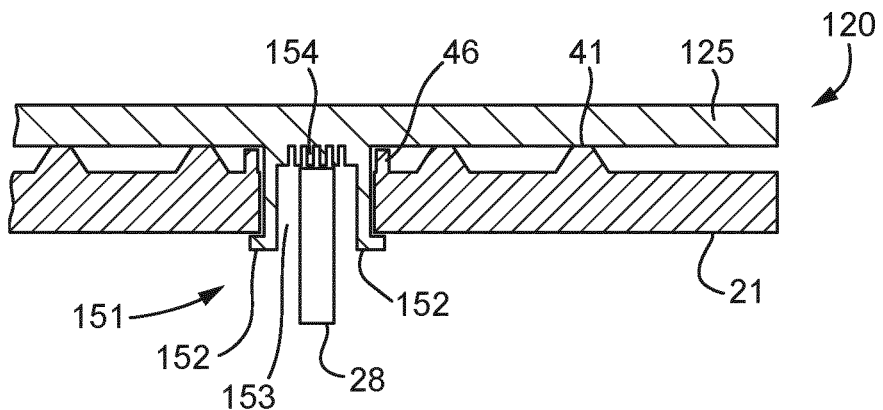
FIG. 20 is a schematic cross-sectional view of a mechanism for connecting a carrier plate to a first support body according to an embodiment of the invention.
Figure 21:
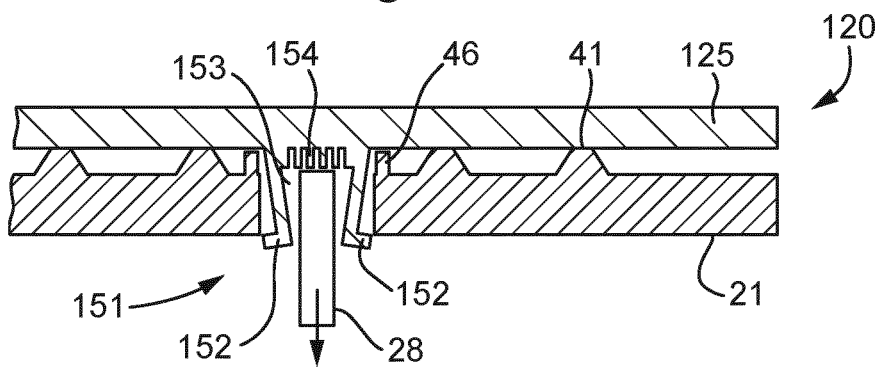
FIG. 21 is a schematic cross-sectional view part way through a process of disconnecting the carrier plate from the first support body shown in FIG. 20.
Figure 22:
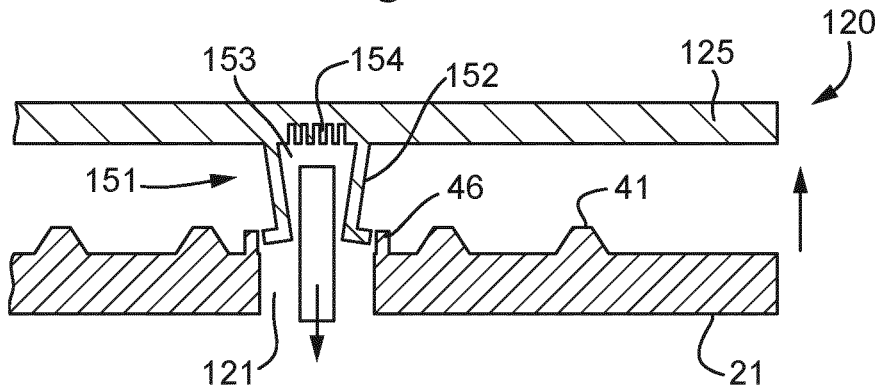
FIG. 22 is a schematic cross-sectional view of the carrier plate disconnected from the first support body shown in FIG. 20.

FIGS. 20 to 22 show different stages of a carrier plate 120 being released form a first support body 21 according to an embodiment of the invention. As shown in FIG. 20, in an embodiment the carrier plate 120 comprises at least one connection mechanism 151. The connection mechanism 151 is configured to mechanically lock the carrier plate 120 to the first support body 21. In an embodiment, the connection mechanism 151 locks the carrier plate 120 to the first support body 21 at a respective pin hole 121 of the first support body 21.

As shown in FIG. 20, in an embodiment the connection mechanism 151 comprises a chamber 153. The chamber 153 is configured to receive a respective pin 28. The chamber 153 receives the contacting end of the pin 28 when the pin 28 supports the carrier plate 120. In an embodiment the connection mechanism 151 is configured to release the lock when pressure within the chamber 153 is sufficiently lower than ambient pressure outside of the chamber 153 such that the carrier plate 120 can be released from the first support body 21. The carrier plate 120 can be released from the first support body 21 when the lock is released.

As shown in FIG. 20, in an embodiment the connection mechanism 151 comprises at least one locking element 152. The locking element 152 is configured to extend through the pin hole 121 and engage with the surface of the first support body 21 that faces away from the base plate 125 of the carrier plate 120. The number of locking elements 152 is not particularly limited. In an embodiment, two, three, four or more than four locking elements 152 are provided. The locking elements 152 may be evenly distributed circumferentially around the pin hole 121. In an embodiment, the locking element 152 is substantially continuous circumferentially around the inner surface of the pin hole 121. The locking element 152 is fixedly connected at one end to the base plate 125 of the carrier plate 120. In an embodiment the locking element 152 is formed integrally with the base plate 125 of the carrier plate 120.

In an embodiment, the chamber 153 is connected to an underpressure so as to reduce the pressure in the chamber 153. The chamber 153 is connected to the underpressure when the carrier plate 120 is to be released from the first support body 21. As mentioned above, in an embodiment the pin 28 comprises a channel for extracting fluid from beyond the contacting end of the pin 28. In an embodiment, the channel in the pin 28 in configured to extract fluid from the chamber 153 so as to reduce the pressure in the chamber 153. As shown in FIG. 20, in an embodiment a plurality of pores 154 are provided for fluidly connecting the channel of the pin 28 to the chamber 153. The number and form of the pores 154 is not particularly limited. In an embodiment a mesh comprising the pores 154 is provided. In an embodiment, the mesh is formed integrally with the base plate 125 of the carrier plate 120. In an embodiment, the contacting end of the pin 28 is not completely perpendicular to the longitudinal direction of the pin 28 such that the channel within the pin 28 is fluidly connected with the chamber 153 when the pin 28 is supporting the carrier plate 120.

FIG. 21 shows the process step in which the pressure in the chamber 153 is reduced. As a result of the reduction in pressure in the chamber 153, the locking elements 152 bend inwardly towards the pin 28. This causes the locking elements 152 to cease engagement with the surface of the first support body 21 that faces away from the base plate 125 of the carrier plate 120. When the locking elements 152 stop engaging with the first support body 21, the carrier plate 120 is no longer locked to the first support body 21. As shown in FIG. 22, the carrier plate 120 can then be released from the first support body 21.

Figure 23:
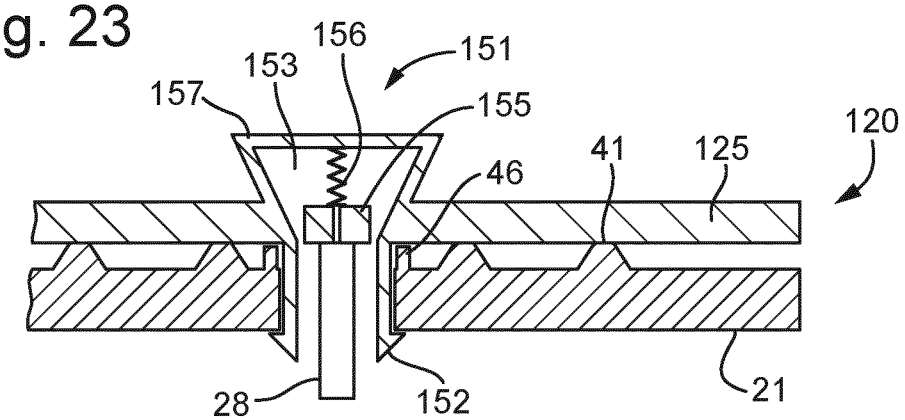
FIG. 23 is a schematic cross-sectional view of a mechanism for connecting a carrier plate to a first support body according to an embodiment of the invention.
Figure 24:
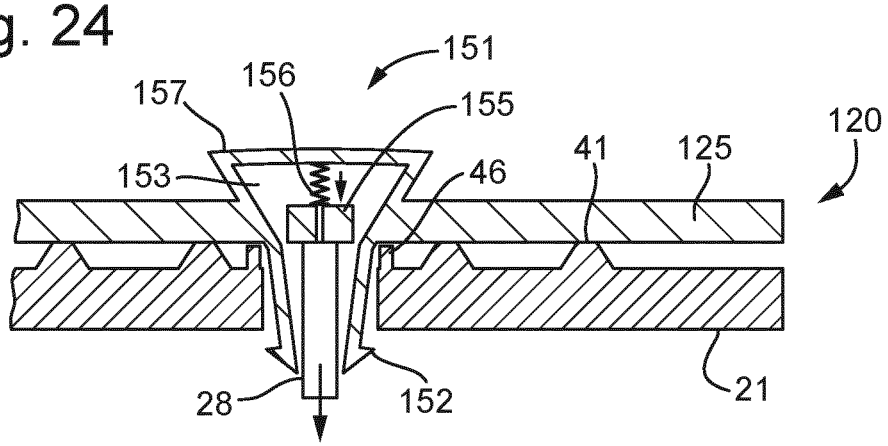
FIG. 24 is a schematic cross-sectional view part way through a process of disconnecting the carrier plate from the first support body shown in FIG. 23.
Figure 25:
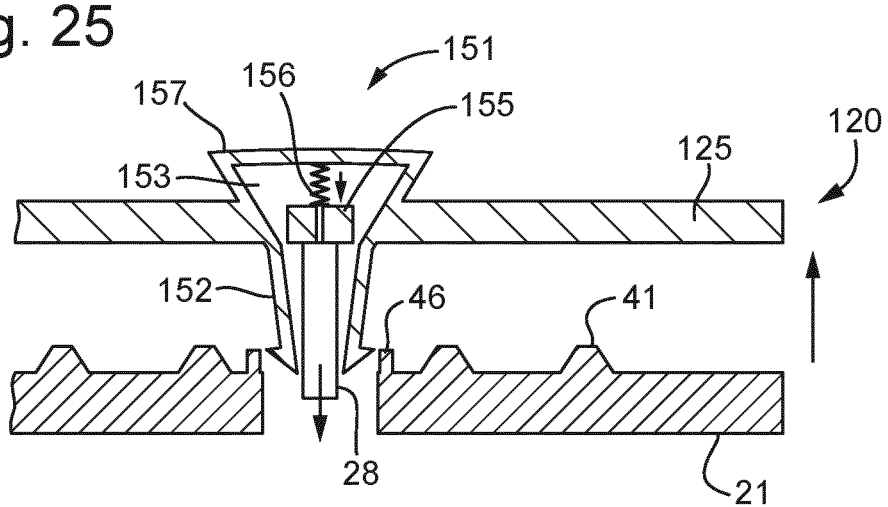
FIG. 25 is a schematic cross-sectional view of the carrier plate disconnected from the first support body shown in FIG. 23.

FIGS. 23 to 25 schematically show an alternative connection mechanism 151 according to an embodiment of the invention. As shown in FIG. 23, in an embodiment the chamber 153 is defined by a housing 157. In an embodiment, part of the housing 157 protrudes out from the surface of the carrier plate 120 that faces away from the first support body 21. In an embodiment, the housing 157 is formed as a separate component from the base plate 125 and is subsequently connected to the base plate 125. An embodiment of the invention is expected to make it easier to manufacture the carrier plate 120. The design of the base plate 125 is made more simple.

In an embodiment, the material used for the housing 157 is different from the material used for the base plate 125 of the carrier plate 120. As shown in FIG. 23, in an embodiment the locking element 152 is formed integrally with the housing 157 that defines the chamber 153.

As shown in the FIG. 23, in an embodiment the carrier plate 120 comprises an unlock channel part 155. The unlock channel part 155 defines an unlock channel through which fluid can flow for unlocking the carrier plate 120 from the first support body 21. As shown in FIG. 23, in an embodiment the carrier plate 120 comprises a resilient member 156 configured to connect the housing 157 to the unlock channel part 155. In an embodiment the unlock channel part 155 is part of the base plate 125 of the carrier plate 120.

As shown in FIG. 24, in an embodiment the channel within the pin 28 is connected to the unlock channel within the unlock channel part 155. This allows the pressure in the chamber 153 to be reduced. When the pressure within the chamber 153 is reduced, the housing 157 is forced downwards relative the base plate 125 of the carrier plate 120. As shown in FIG. 24, in an embodiment the housing 157 comprises a section angled relative to a surface of the base plate 125 such that downwards movement of the housing 157 relative to the base plate 125 causes the locking element 152 to bend. When the locking element 152 bends, the locking element 152 ceases to engage with the first support body 21. When the locking element 152 no longer engages with the first support body 21, the carrier plate 120 is unlocked from the first support body 21. The resilient member 156 can be compressed when the pressure in the chamber 153 is reduced. Otherwise, the resilient member 156 maintains a higher position of the housing 157 relative the base plate 125 of the carrier plate 120 as shown in FIG. 23. As shown in FIG. 25, when the carrier plate 120 is unlocked, the carrier plate 120 can be released from the first support body 21.

Figure 26:
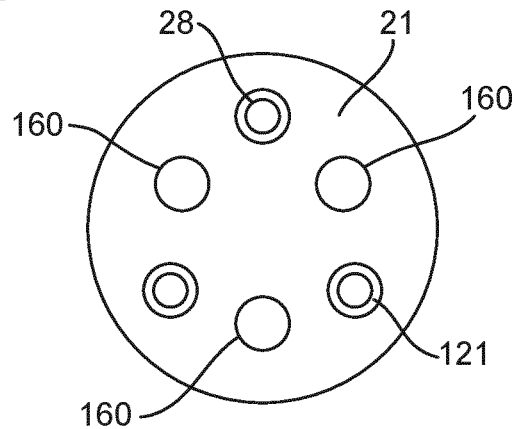
FIG. 26 is a schematic plan view of a first support body according to an embodiment of the invention.

It is not essential for a carrier plate 120 to be provided. FIG. 26 is a schematic plan view of a first support body 21 according to an embodiment of the invention. As shown in FIG. 26, in an embodiment no carrier plate 120 is provided. As a result, the pins 28 can extend freely through the respective pin holes 121. In an embodiment the pins 28 are not used to lower the first support body 21 onto the main body 22 of the substrate support 20. In an embodiment, an additional set of pins 160 are provided at different locations from the pins 28 that are used to lower the substrate W. The outlines of the tops of the pins 160 are shown in FIG. 26. In an embodiment, a further set of pin holes for accommodating the pins 160 are provided in the parts of the substrate support 20 lower than the first support body 21. For example, such a further set of pin holes is provided in the main body 22. The pins 160 extend through the further set of pin holes in the main body 22 and support the lower surface of the first support body 21. Meanwhile, the pins 28 for supporting the substrate W extend through the pin holes 121 that extend through both the main body 22 and the first support body 21.

In an alternative embodiment, the pins 28 that are used for lowering the substrate W support the first support body 21 when the first support body 21 has a rotational position different from its target position on the main body 22. The first support body 21 can be supported by the pins 28 and lowered onto the main body 22 in its rotated orientation. The carrier plate 120 is not required because the pin holes 121 through the first support body 21 do not line up with the pins 28. This is because the first support body 21 is rotated relative to its final target position. Once the first support body 21 is supported by the main body 22, the first support body 21 is then rotated so as to reach its target rotational position on the main body 22. When the first support body 21 is in its target position on the main body 22, the pin holes 121 line up between the first support body 21 and the main body 22 such that the pins 28 can extend through the pin holes 121 so as to support the substrate W above the first support body 21. In an embodiment, a rotation tool is provided to orient the first support body 21 rotationally on the main body 22. By rotating the first support body 21 once it is supported by the main body 22, it is not necessary to provide a carrier plate 120 and it is not necessary to provide a separate set of pins 160.

Figure 27:
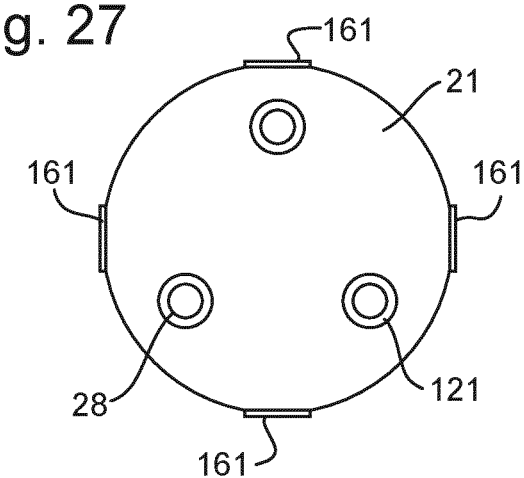
FIG. 27 is a schematic plan view of a first support body according to an embodiment of the invention being gripped for handling.

FIG. 27 is a schematic plan view of a first support body 21 according to an embodiment of the invention. In the view shown in FIG. 27, the first support body 21 is being gripped for handling. As shown in the FIG. 27, in an embodiment a plurality of edge grippers 161 are provided for gripping the first support body 21. The edge grippers 161 are configured to grip the outer edge of the first support body 21. In an embodiment, the edge grippers 161 are comprised in a separate handing tool for handling the first support body 21. By providing a separate handling tool, it is not necessary to use the pins 28 to lower the first support body 21 and it is not necessary to provide a carrier plate 120.

Figure 28:
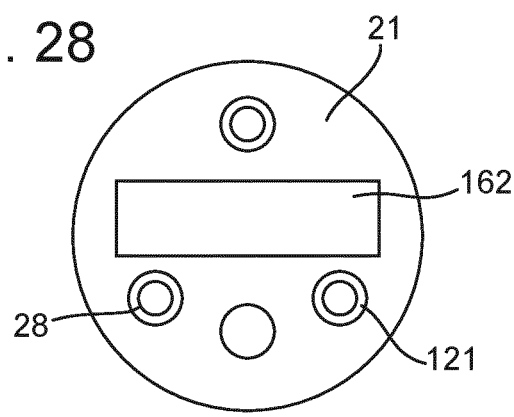
FIG. 28 is a schematic plan view of a first support body according to an embodiment of the invention being gripped for handling.

FIG. 28 is a schematic plan view of a first support body 21 according to an embodiment of the invention. In the view shown in FIG. 28, the first support body 21 is being gripped for handling. As shown in FIG. 28, in an embodiment a top gripper 162 is provided for gripping the top of the first support body 21. By providing the top gripper 162, it is not necessary to provide a carrier plate 120 or to provide a separate set of pins 160 for handling the support body 21. In an embodiment, the top gripper 162 is comprised in a separate handling tool for handling the first support body 21. The separate handling tool is separate from the pins 28 that are used for lowering the substrate W onto the first support body 21.

Features shown in the different embodiments illustrated in the Figures can be combined with each other unless it is apparent that they are incompatible. Merely as an example, the feature of providing burls 47 at the underside of the first support body 21 (shown in FIG. 8) may be applied to the arrangement shown in FIG. 5, 9, 10 or 11. In particular, the arrangement shown in FIG. 9 could be modified by replacing the burls 65 which are at the upper side of the main body 22 with burls 47 being provided at the underside of the first support body 21. Other combinations of features shown in the Figures are equally possible.

Embodiments are provided according to the following clauses:

1. A substrate support for supporting a substrate in a lithographic apparatus, the substrate support comprising:
    a first support body configured to support the substrate;
    a main body separate from the first support body and configured to support the first support body, the main body comprising a thermal conditioner configured to thermally condition the main body, and/or the first support body and/or the substrate; and
    an extractor body surrounding the main body and the first support body, wherein the extractor body comprises a first extraction channel configured to extract fluid from near a peripheral part of the substrate.

2. The substrate support of clause 1, comprising:
    a second support body separate from the main body and configured to support the main body on a substrate stage, the second support body configured to reduce relative movement between the substrate support and the substrate stage.

3. The substrate support of clause 1 or 2, wherein the main body comprises at its upper side a plurality of burls having distal ends in a plane configured to support the first support body or wherein the first support body comprises at its lower side a plurality of burls having distal ends in a plane configured to contact an upper side of the main body.

4. The substrate support of any of clauses 1 to 3, wherein the extractor body comprises a second extraction channel configured to extract fluid from radially inward of the first extraction channel, preferably wherein the second extraction channel is configured to extract fluid from below the peripheral part of the substrate so as to prevent liquid from reaching a space between a central part of the substrate and the first support body, and preferably wherein the second extraction channel is spaced apart from the first extraction channel by an open gap.

5. The substrate support of any of clauses 1 to 4, wherein an open gap or a flow passage is formed between the extractor body and the main body and the first support body, or wherein the extractor body forms an integral part of the main body.

6. The substrate support of clause 5, wherein the open gap or the flow passage is in fluid communication with ambient pressure or a pressure source, and/or wherein the main body extends below the extractor body and a lower side of the extractor body is coupled to the main body, preferably wherein an adhesive layer is provided between the extractor body and the main body.

7. The substrate support of any preceding clauses, wherein thermal conditioner is attached at an under surface of the main body, and/or wherein pin holes extend through the first support body in a thickness direction of the first support body, the pin holes configured such that respective pins can extend through the pin holes to lower a substrate onto the first support body.

8. The substrate support of clause 7, comprising a carrier plate configured to be couplable to and releasable from the first support body, the carrier plate being configured such that when the carrier plate is coupled to the first support body, the carrier plate covers the pin holes.

9. The substrate support of clause 8, wherein:
    the first support body comprises at its upper side a plurality of burls having distal ends in a plane configured to support the substrate; and
    the carrier plate comprises connection protrusions configured such that the carrier plate is supported by the first support body between the burls at the upper side of the first support body with the distal ends of the burls at the upper side of the first support body being spaced from the carrier plate, or wherein:
    the first support body comprises at its upper side a plurality of burls having distal ends in a plane configured to support the substrate; and
    the carrier plate is sufficiently flat at its surface facing the first support body that the distal ends of the burls at the upper side of the first support body support the carrier plate when the carrier plate is coupled to the first support body.

10. The substrate support of clause 8 or 9, comprising:
    a bonding material for temporarily bonding the carrier plate to the first support body when the carrier plate is coupled to the first support body, and/or wherein the carrier plate comprises at least one internal channel for fluidly connecting a first opening to at least one second opening, the first opening being at a position where the carrier plate covers one of the pin holes when the carrier plate is coupled to the first support body, and the second opening being at a position where the carrier plate faces the first support body at its upper side, and/or wherein the carrier plate comprises an electrically conductive material and an insulating layer configured to electrically insulate the electrically conductive material from the first support body when the carrier plate is coupled to the first support body, and/or wherein the carrier plate comprises at least one connection mechanism configured to mechanically lock the carrier plate to the first support body at a respective pin hole of the first support body.

11. The substrate support of clause 10, wherein the connection mechanism comprises a chamber configured to receive a respective pin, wherein the connection mechanism is configured to release the lock when pressure within the chamber is sufficiently lower than ambient pressure outside of the chamber such that the carrier plate can be released from the first support body.

12. A substrate table comprising:
    a substrate stage; and
    the substrate support of clause 5 or 6, wherein a lower side of the extractor body is attached to the substrate stage.

13. The substrate table of clause 12, comprising:
    a height adjustment mechanism configured to control a height of at least part of the extractor body below the substrate such that the extractor body is configured to prevent liquid from reaching between a central part of the substrate and the first support body.

14. The substrate table of clause 13, wherein the height adjustment mechanism comprises:
    an insert member between the lower side of the extractor body and the substrate stage; and
    a fastener configured to fasten the extractor body to the insert member,
    wherein the insert member is structured with cut-out sections such that the insert member compresses when the fastener fastens the extractor body to the insert member so as to control the height of the extractor body below the substrate, or wherein:
    the extractor body comprises a leaf spring comprising:
    a lower part fixed to the rest of the extractor body; and
    an upper part that extends between the extractor body and the first support body; and the height adjustment mechanism is configured to control the height of the upper part below the substrate such that the upper part is configured to prevent liquid from reaching between a central part of the substrate and the first support body.

15. A substrate table comprising:
a substrate stage; and
the substrate support of any of clauses 1 to 4, wherein the extractor body is provided in the substrate stage.

The invention claimed is:

1. A substrate support for supporting a substrate in a lithographic apparatus, the substrate support comprising:
a first support body configured to support the substrate;
a main body separate from the first support body and configured to removably support the first support body, the main body comprising a thermal conditioner configured to thermally condition the main body and/or first support body and/or substrate; and
an extractor body surrounding the main body and the first support body, wherein the extractor body comprises a first extraction channel configured to extract fluid from near a peripheral part of the substrate.

2. The substrate support of claim 1, comprising a second support body separate from the main body and configured to support the main body on a substrate stage, the second support body configured to reduce relative movement between the substrate support and the substrate stage.

3. The substrate support of claim 1, wherein the main body comprises at its upper side a plurality of burls having distal ends in a plane configured to support the first support body or wherein the first support body comprises at its lower side a plurality of burls having distal ends in a plane configured to contact an upper side of the main body.

4. The substrate support of claim 1, wherein the extractor body comprises a second extraction channel configured to extract fluid from inward, relative to a central part of the substrate support, of the first extraction channel.

5. The substrate support of claim 1, wherein an open gap or a flow passage is formed between the extractor body and the main body and between the extractor body and the first support body.

6. The substrate support of claim 5, wherein the open gap or the flow passage is in fluid communication with ambient pressure or a pressure source.

7. The substrate support of claim 1, wherein pin holes extend through the first support body in a thickness direction of the first support body, the pin holes configured to allow respective pins to extend through respective pin holes to lower a substrate onto the first support body.

8. The substrate support of claim 7, further comprising a carrier plate configured to be couplable to and releasable from the first support body, the carrier plate configured such that when the carrier plate is coupled to the first support body, the carrier plate covers the pin holes.

9. The substrate support of claim 8, wherein:
the first support body comprises at its upper side a plurality of burls having distal ends in a plane configured to support the substrate; and
the carrier plate comprises connection protrusions configured such that the carrier plate is supported by the first support body between the plurality of burls at the upper side of the first support body with the distal ends of the plurality of burls at the upper side of the first support body being spaced from the carrier plate, or wherein:

the first support body comprises at its upper side a plurality of burls having distal ends in a plane configured to support the substrate; and
the carrier plate has a surface configured to face the first support body so that the distal ends of the plurality of burls at the upper side of the first support body support the carrier plate when the carrier plate is coupled to the first support body.

10. The substrate support of claim 8 wherein the carrier plate comprises at least one connection mechanism configured to mechanically lock the carrier plate to the first support body at a respective pin hole of the first support body.

11. The substrate support of claim 10, wherein the at least one connection mechanism comprises a chamber configured to receive a respective pin, wherein the connection mechanism is configured to release the lock when pressure within the chamber is lower than ambient pressure outside of the chamber to allow the carrier plate to be released from the first support body.

12. A substrate table comprising:
a substrate stage; and
the substrate support of claim 5, wherein a lower side of the extractor body is attached to the substrate stage.

13. The substrate table of claim 12, further comprising a height adjustment mechanism configured to control a height of at least part of the extractor body below the substrate such that the extractor body is configured to prevent liquid from reaching between a central part of the substrate and the first support body.

14. The substrate table of claim 13, wherein:
the height adjustment mechanism comprises:
an insert member between the lower side of the extractor body and the substrate stage; and
a fastener configured to fasten the extractor body to the insert member,
wherein the insert member is structured with cut-out sections such that the insert member compresses when the fastener fastens the extractor body to the insert member so as to control the height of the extractor body below the substrate, or
the extractor body comprises a leaf spring comprising:
a lower part fixed to the rest of the extractor body; and
an upper part that extends between the extractor body and the first support body; and
the height adjustment mechanism is configured to control the height of the upper part below the substrate such that the upper part is configured to prevent liquid from reaching between a central part of the substrate and the first support body.

15. A substrate table comprising:
a substrate stage; and
the substrate support of claim 1, wherein the extractor body is provided in the substrate stage.

16. The substrate support of claim 1, wherein the extractor body forms an integral part of the main body.

17. The substrate support of claim 1, wherein the main body extends below the extractor body and a lower side of the extractor body is coupled to the main body.

18. The substrate support of claim 1, wherein the thermal conditioner is attached at an under surface of the main body.

19. The substrate support of claim 8, wherein the carrier plate comprises an electrically conductive material and an insulating layer configured to electrically insulate the electrically conductive material from the first support body when the carrier plate is coupled to the first support body.

20. The substrate support of claim 8, wherein the carrier plate comprises at least one internal channel for fluidly connecting a first opening to at least one second opening, the first opening being at a position where the carrier plate covers one of the pin holes when the carrier plate is coupled to the first support body, and the second opening being at a position where the carrier plate faces the first support body at its upper side.

* * * * *